United States Patent
Lee

(10) Patent No.: US 11,257,821 B1
(45) Date of Patent: Feb. 22, 2022

(54) DIGIT LINE AND BODY CONTACT FOR SEMICONDUCTOR DEVICES

(71) Applicant: Micron Technology, Inc., Boise, ID (US)

(72) Inventor: Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/943,494

(22) Filed: Jul. 30, 2020

(51) Int. Cl.

| | |
|---|---|
| *H01L 27/108* | (2006.01) |
| *H01L 29/06* | (2006.01) |
| *H01L 29/423* | (2006.01) |
| *H01L 29/786* | (2006.01) |
| *H01L 29/66* | (2006.01) |
| *H01L 21/02* | (2006.01) |
| *H01L 21/311* | (2006.01) |

(Continued)

(52) U.S. Cl.
CPC .... *H01L 27/10805* (2013.01); *H01L 21/0217* (2013.01); *H01L 21/02603* (2013.01); *H01L 21/31116* (2013.01); *H01L 21/32055* (2013.01); *H01L 21/32135* (2013.01); *H01L 27/1085* (2013.01); *H01L 27/10873* (2013.01); *H01L 29/0673* (2013.01); *H01L 29/42392* (2013.01); *H01L 29/66742* (2013.01); *H01L 29/78615* (2013.01); *H01L 29/78618* (2013.01); *H01L 29/78696* (2013.01)

(58) Field of Classification Search
CPC ......... H01L 27/10805; H01L 29/78615; H01L 29/42392; H01L 29/78618; H01L 27/10873; H01L 29/78696; H01L 21/02603; H01L 21/31116; H01L 29/66742; H01L 27/1085; H01L 21/32135; H01L 21/0217; H01L 29/0673; H01L 21/32055

See application file for complete search history.

(56) References Cited

U.S. PATENT DOCUMENTS

| | | | |
|---|---|---|---|
| 6,429,484 B1 * | 8/2002 | Yu | H01L 21/8221 257/347 |
| 10,607,995 B2 | 3/2020 | Roberts et al. | |
| 2018/0323200 A1 | 11/2018 | Tang et al. | |

(Continued)

OTHER PUBLICATIONS

U.S. Appl. No. 16/204,224, entitled, "Memory Arrays," filed Nov. 29, 2018, 43 pages.

*Primary Examiner* — Anthony Ho
*Assistant Examiner* — Kevin Quinto
(74) *Attorney, Agent, or Firm* — Brooks, Cameron & Huebsch, PLLC

(57) ABSTRACT

Systems, methods and apparatus are provided for an array of vertically stacked memory cells having horizontally oriented access devices having a first source/drain region and a second source drain region separated by a channel region, and gates opposing the channel region, vertically oriented access lines coupled to the gates and separated from a channel region by a gate dielectric. The memory cells have horizontally oriented storage nodes coupled to the second source/drain region and horizontally oriented digit lines coupled to the first source/drain regions. A vertical body contact is formed in direct electrical contact with a body region of one or more of the horizontally oriented access devices and separate from the first source/drain region and the horizontally oriented digit lines by a dielectric.

29 Claims, 33 Drawing Sheets

(51) Int. Cl.
*H01L 21/3213* (2006.01)
*H01L 21/3205* (2006.01)

(56) References Cited

U.S. PATENT DOCUMENTS

2019/0103406 A1 4/2019 Tang et al.
2019/0164985 A1 5/2019 Lee et al.

* cited by examiner

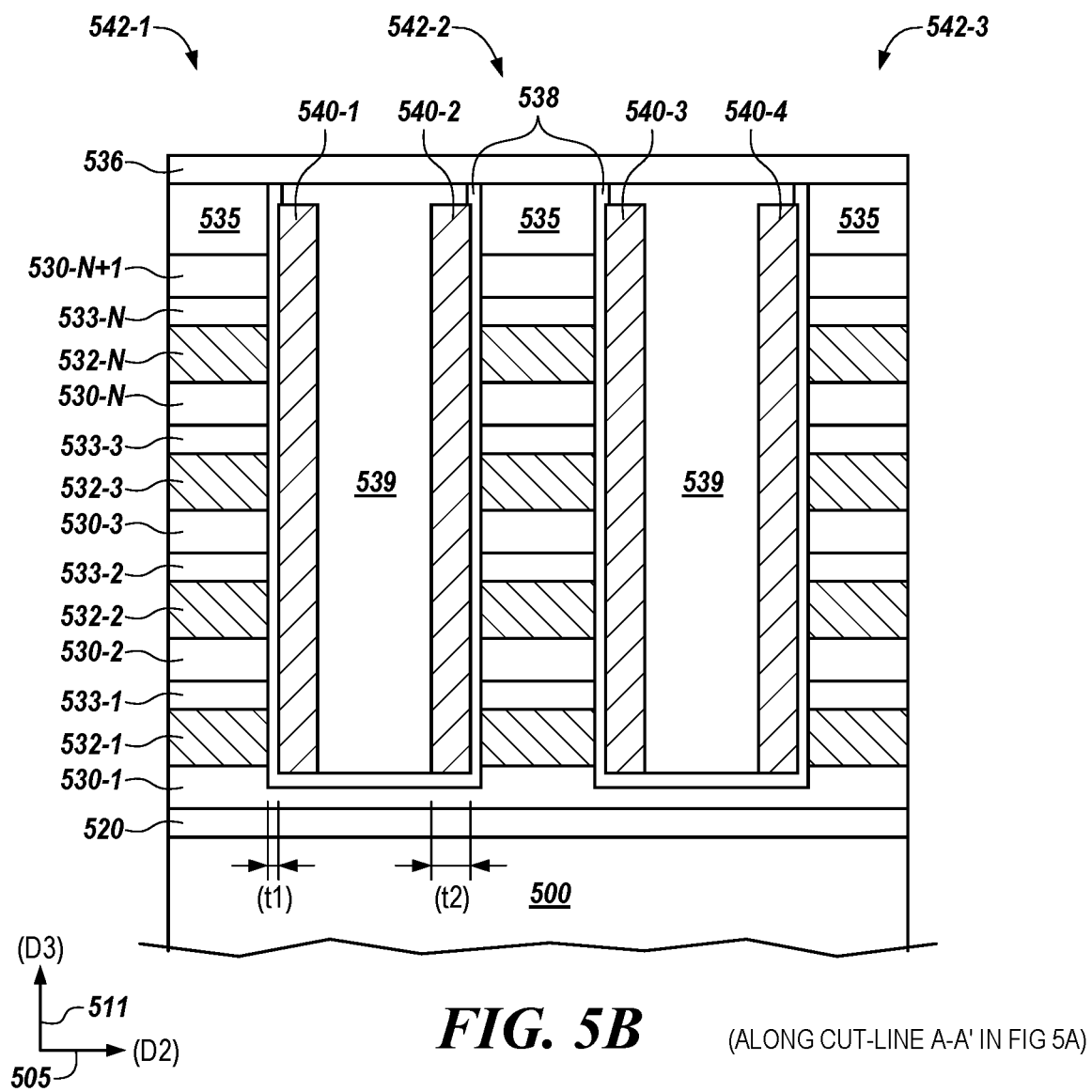
FIG. 5B (ALONG CUT-LINE A-A' IN FIG 5A)

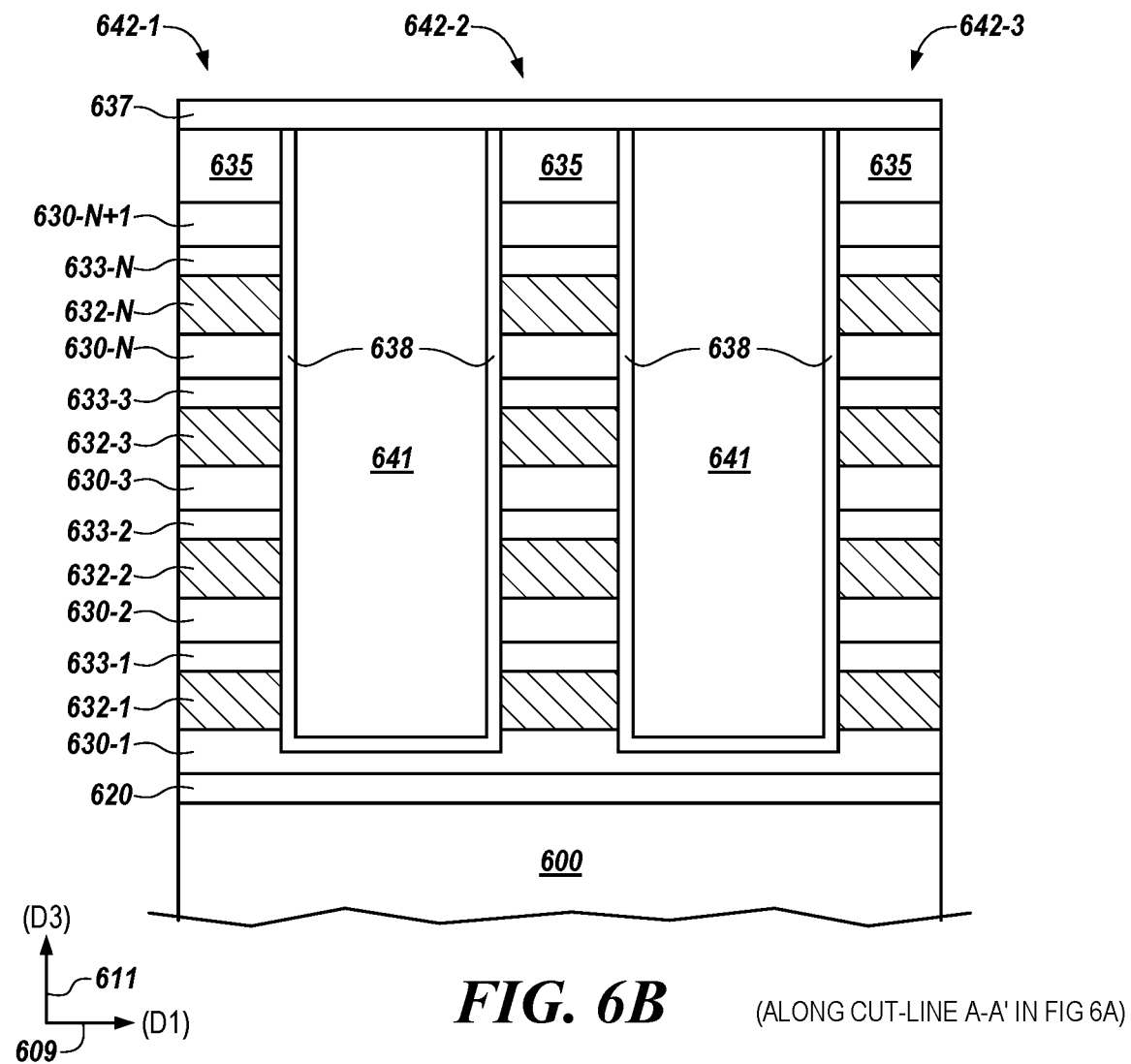
FIG. 6B (ALONG CUT-LINE A-A' IN FIG 6A)

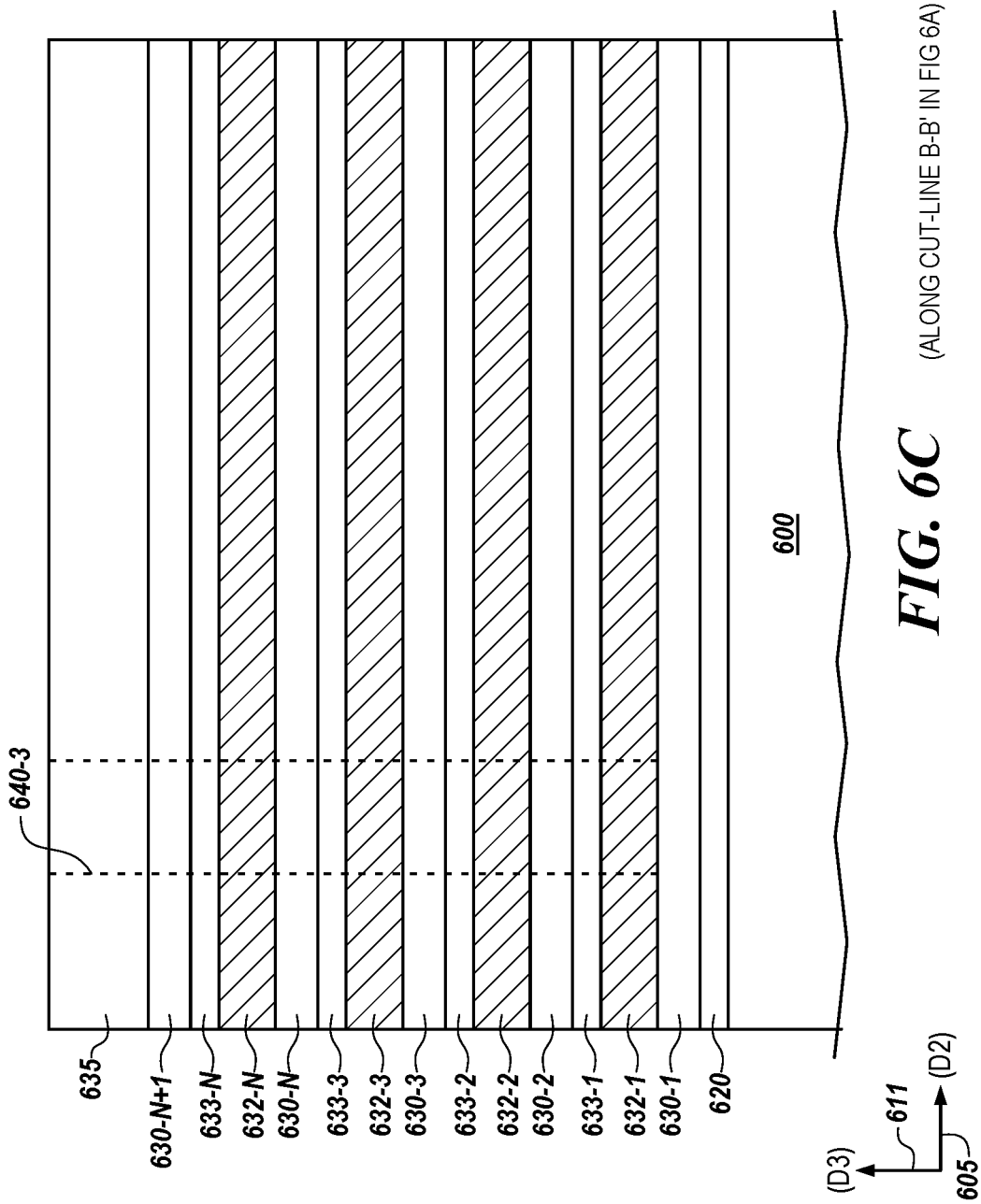
FIG. 6C (ALONG CUT-LINE B-B' IN FIG 6A)

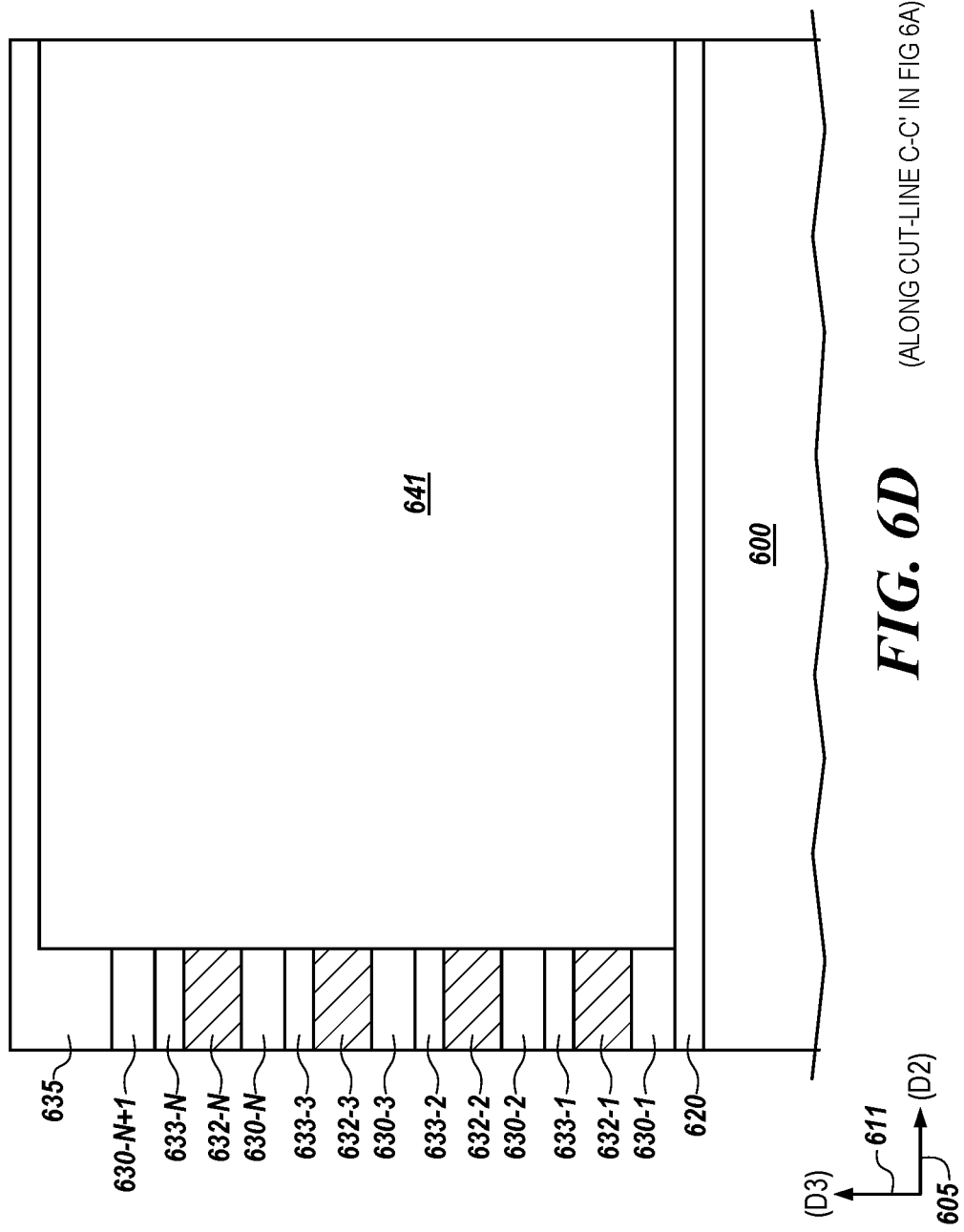

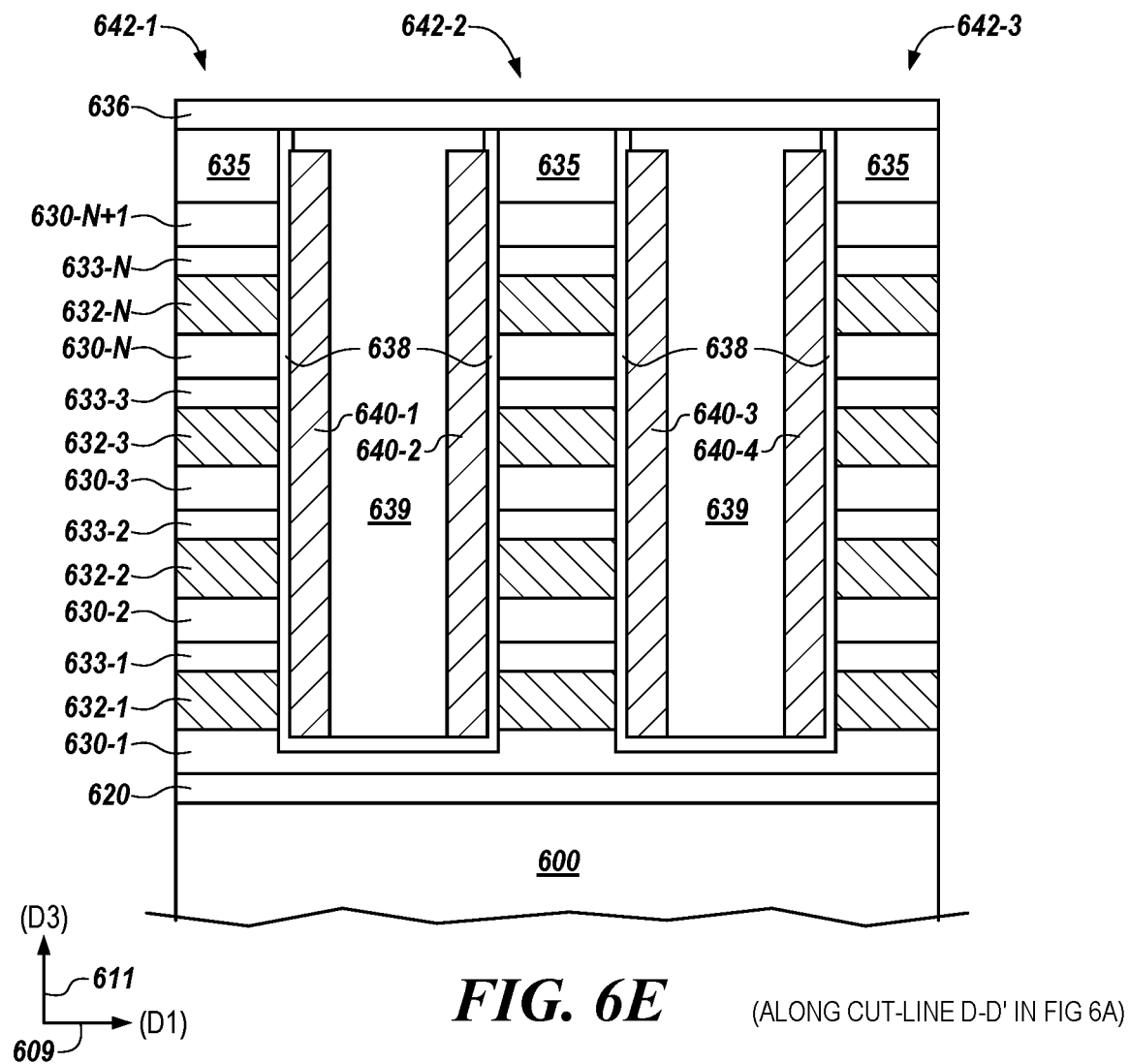
FIG. 6E (ALONG CUT-LINE D-D' IN FIG 6A)

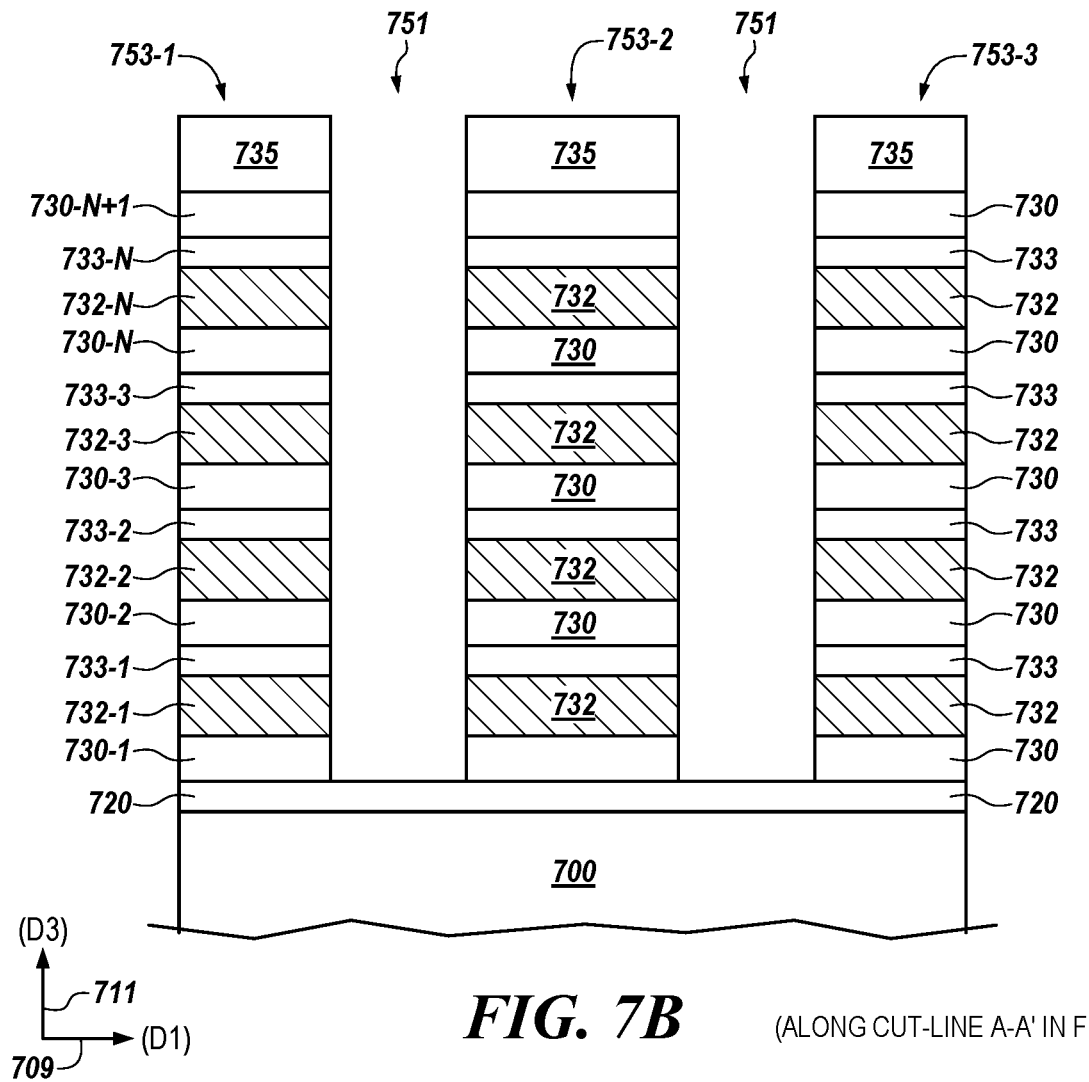
FIG. 7B (ALONG CUT-LINE A-A' IN FIG 7A)

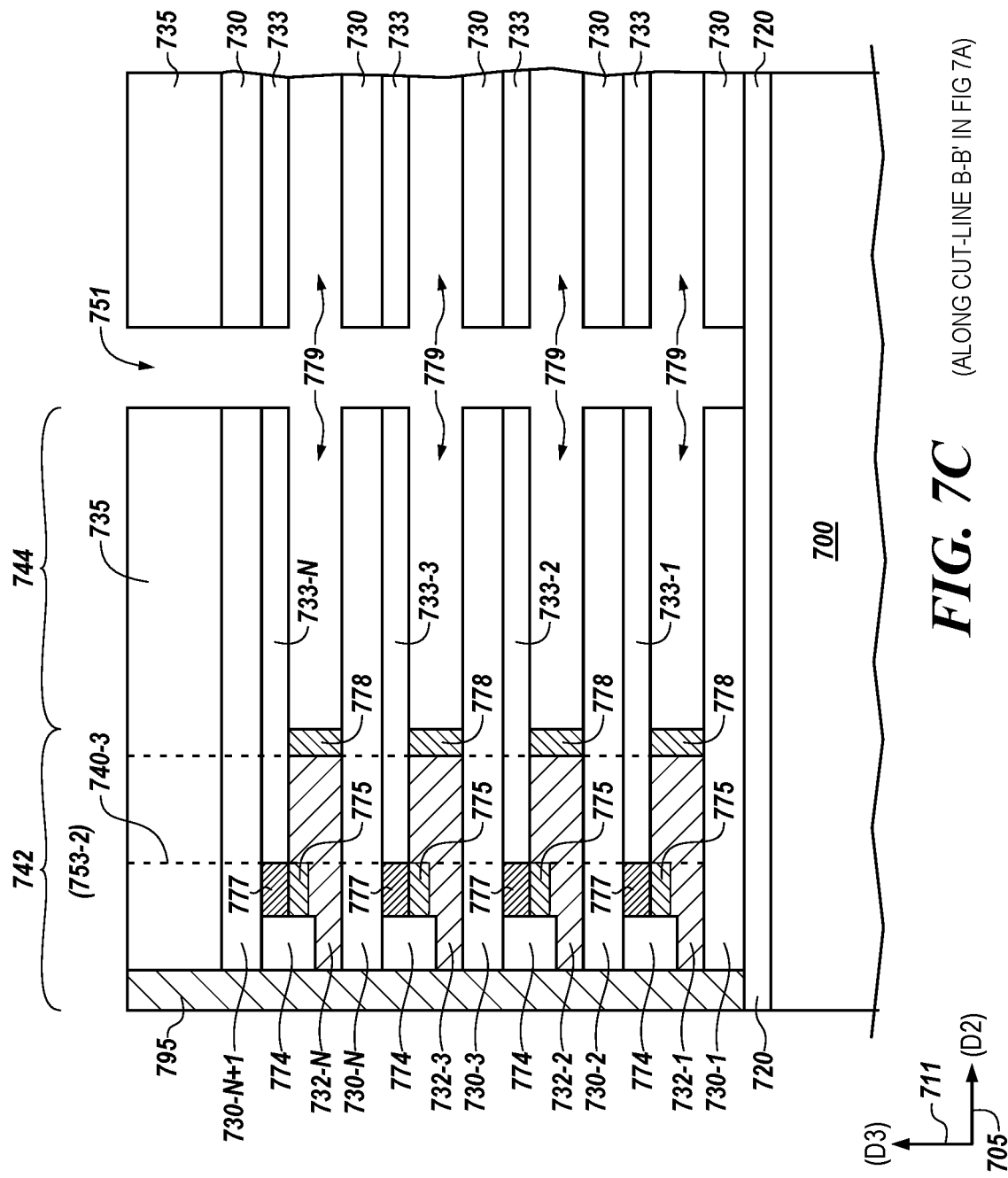
FIG. 7C (ALONG CUT-LINE B-B' IN FIG 7A)

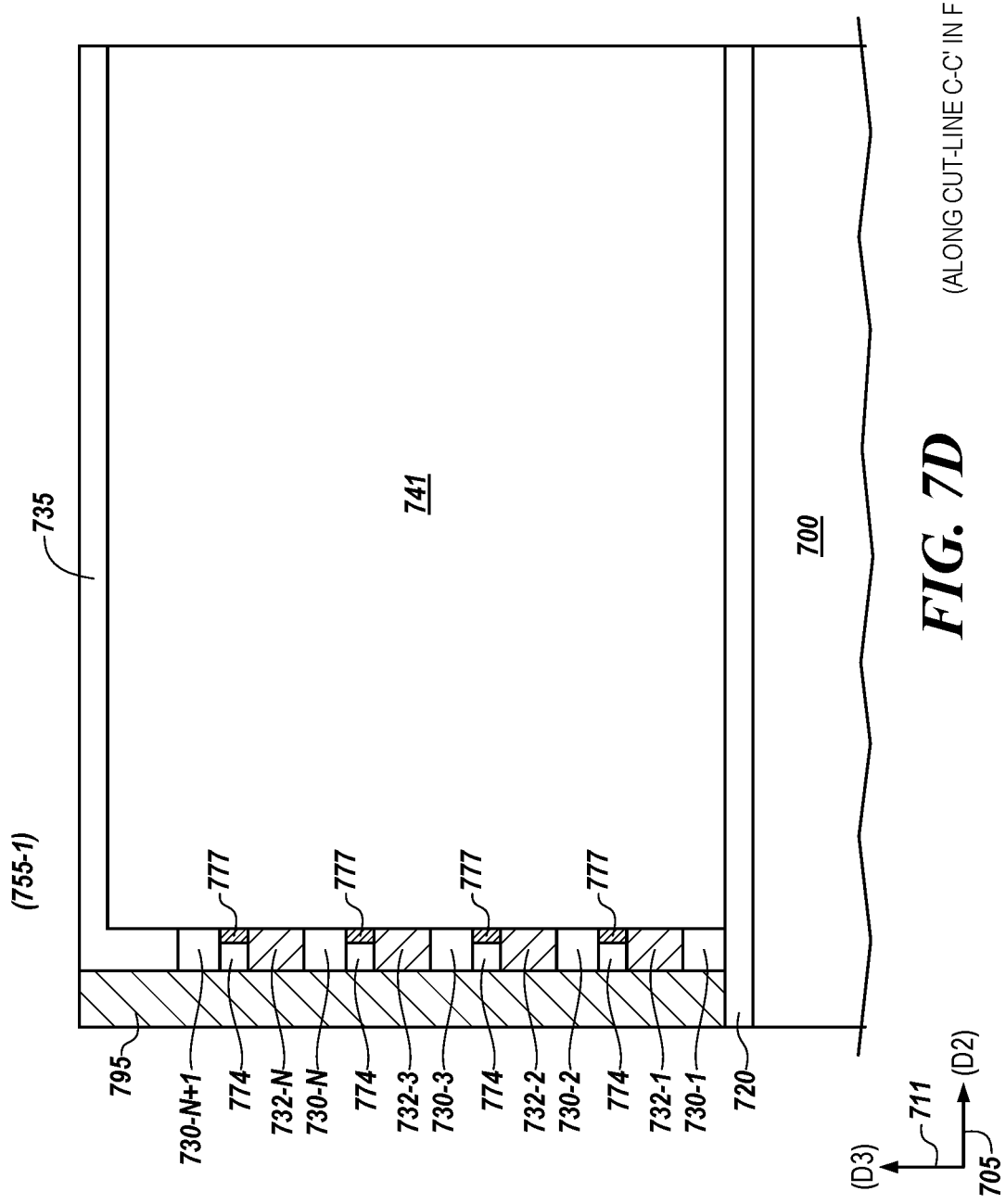
FIG. 7D (ALONG CUT-LINE C-C' IN FIG 7A)

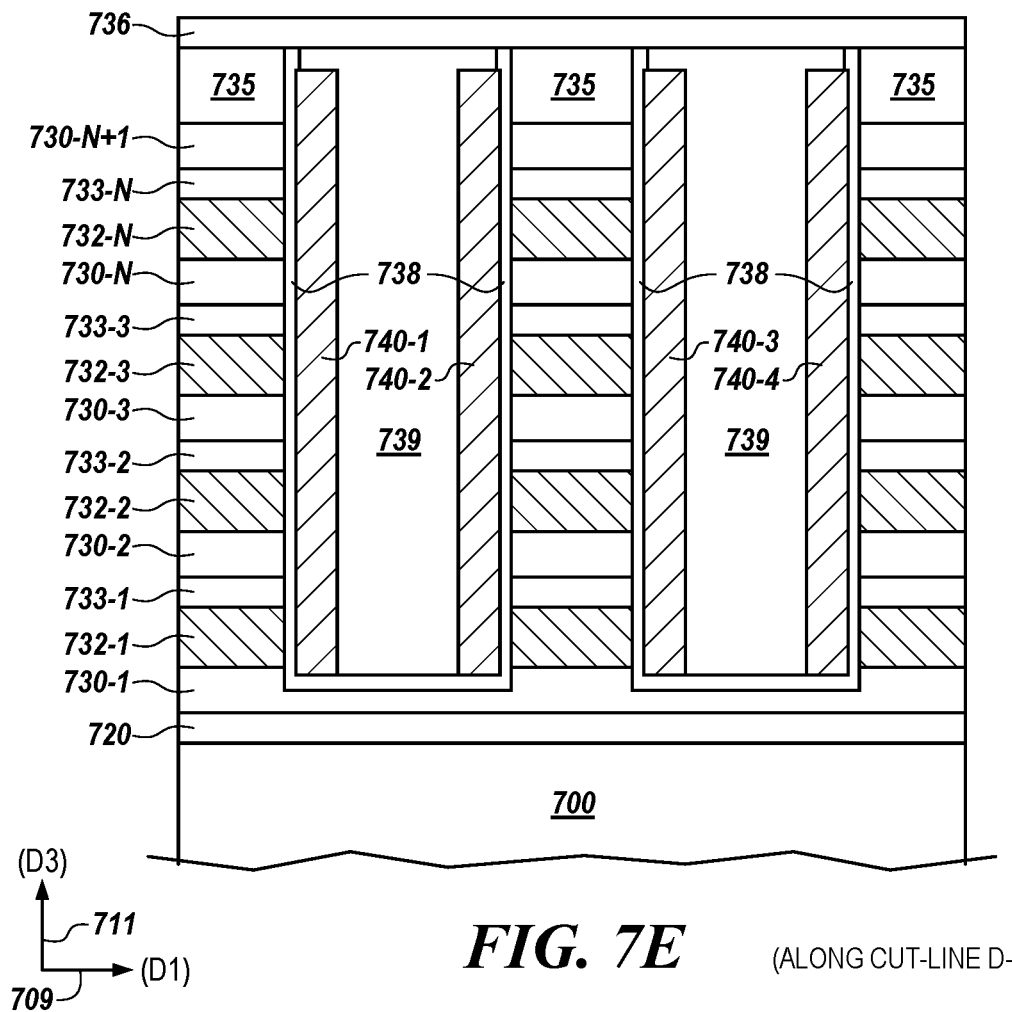
FIG. 7E (ALONG CUT-LINE D-D' IN FIG 7A)

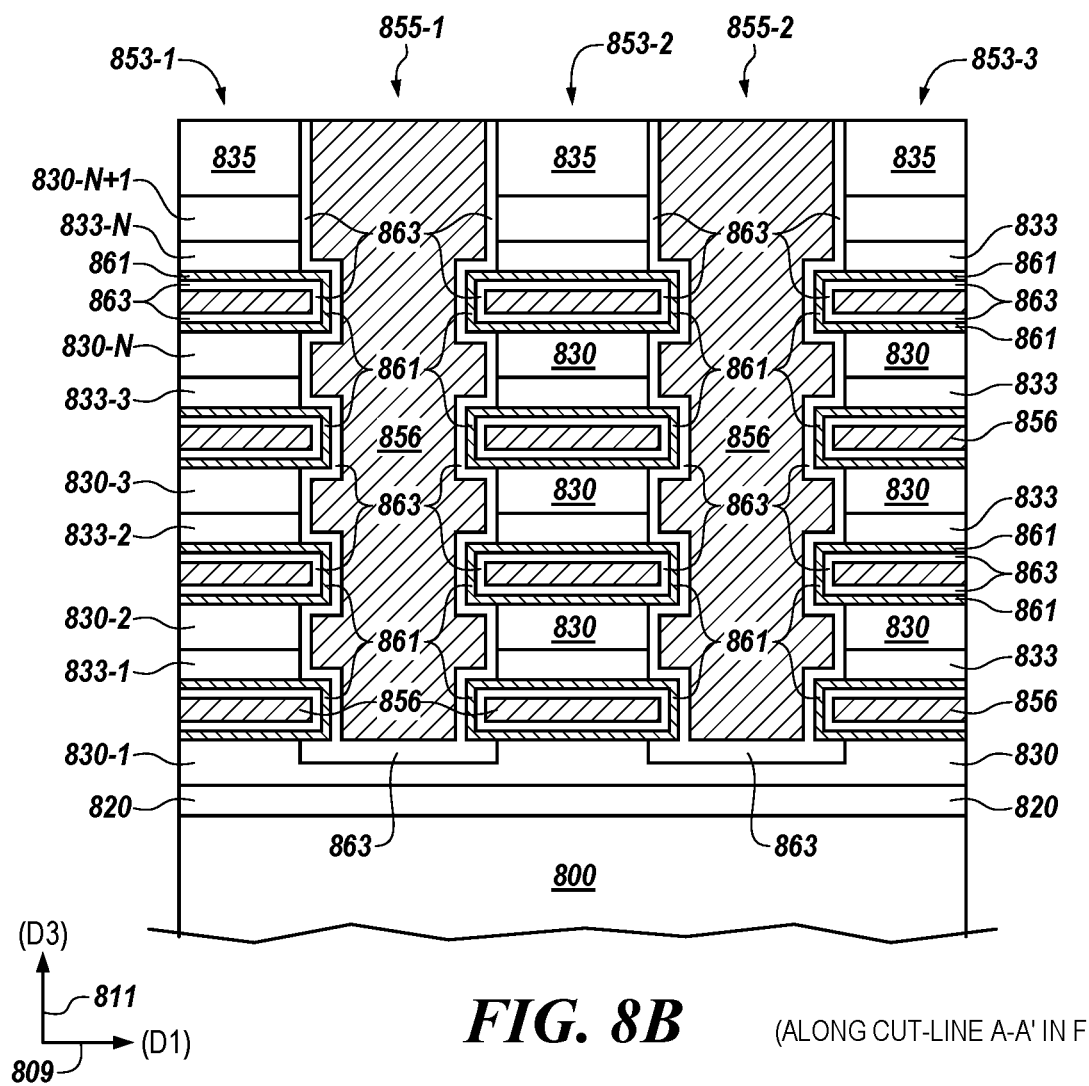
FIG. 8B (ALONG CUT-LINE A-A' IN FIG 8A)

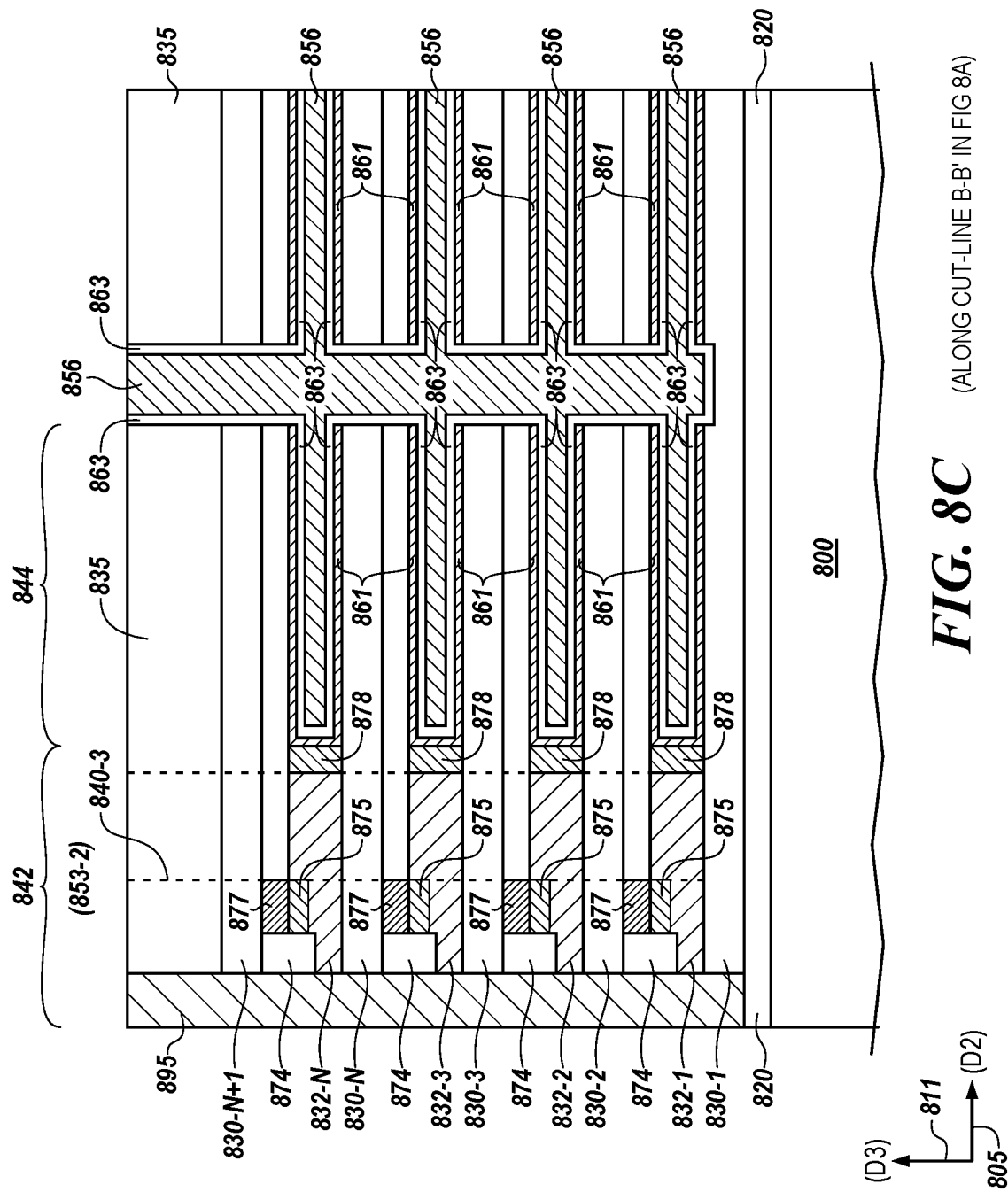
FIG. 8C (ALONG CUT-LINE B-B' IN FIG 8A)

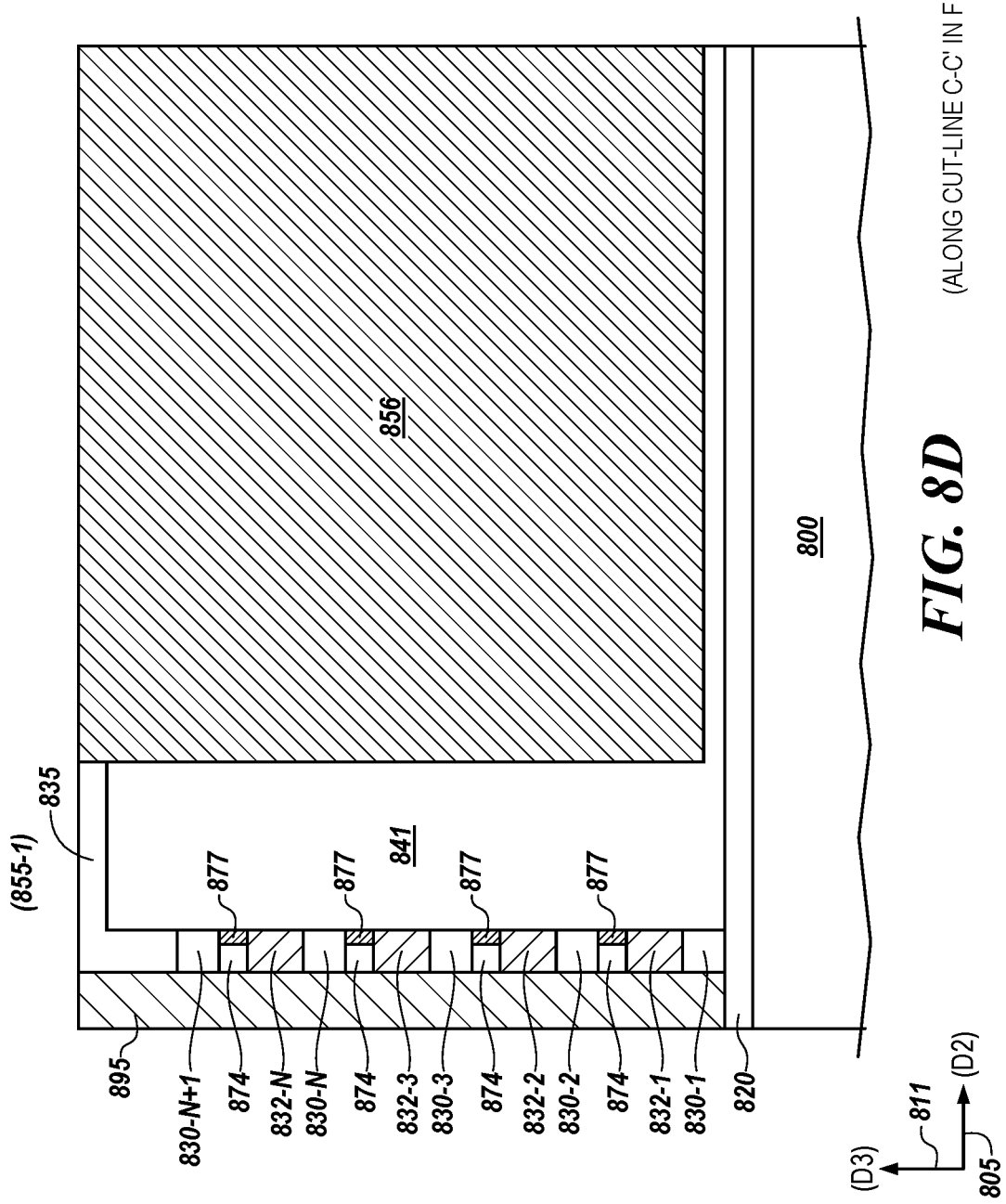
FIG. 8D (ALONG CUT-LINE C-C' IN FIG 8A)

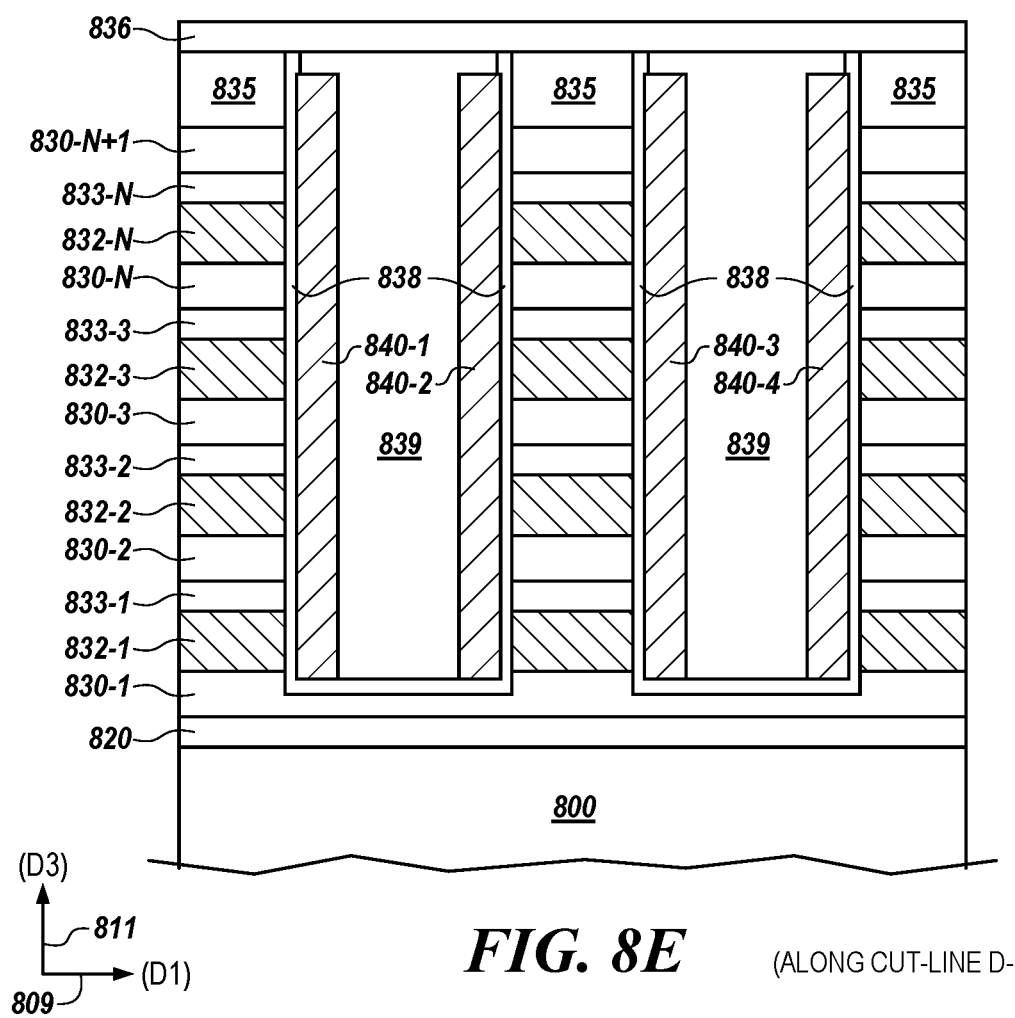
FIG. 8E (ALONG CUT-LINE D-D' IN FIG 8A)

DIGIT LINE AND BODY CONTACT FOR SEMICONDUCTOR DEVICES

TECHNICAL FIELD

The present disclosure relates generally to memory devices, and more particularly, to a digit line and body contact for semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 5A-5B illustrate an example method, at another stage of a semiconductor fabrication process, for forming arrays of vertically stacked memory cells, having digit line and body contact for semiconductor devices and vertically oriented access lines, in accordance with a number of embodiments of the present disclosure.

FIGS. 6A to 6E illustrate an example method, at another stage of a semiconductor fabrication process, for forming arrays of vertically stacked memory cells, having digit line and body contact for semiconductor devices and vertically oriented access lines, in accordance with a number of embodiments of the present disclosure.

FIGS. 7A to 7E illustrate an example method, at another stage of a semiconductor fabrication process, for forming arrays of vertically stacked memory cells, having digit line and body contact for semiconductor devices and vertically oriented access lines, in accordance with a number of embodiments of the present disclosure.

FIGS. 8A to 8E illustrate an example method, at another stage of a semiconductor fabrication process, for forming arrays of vertically stacked memory cells, having digit line and body contact for semiconductor devices and vertically oriented access lines, in accordance with a number of embodiments of the present disclosure.

DETAILED DESCRIPTION

Figure 1:
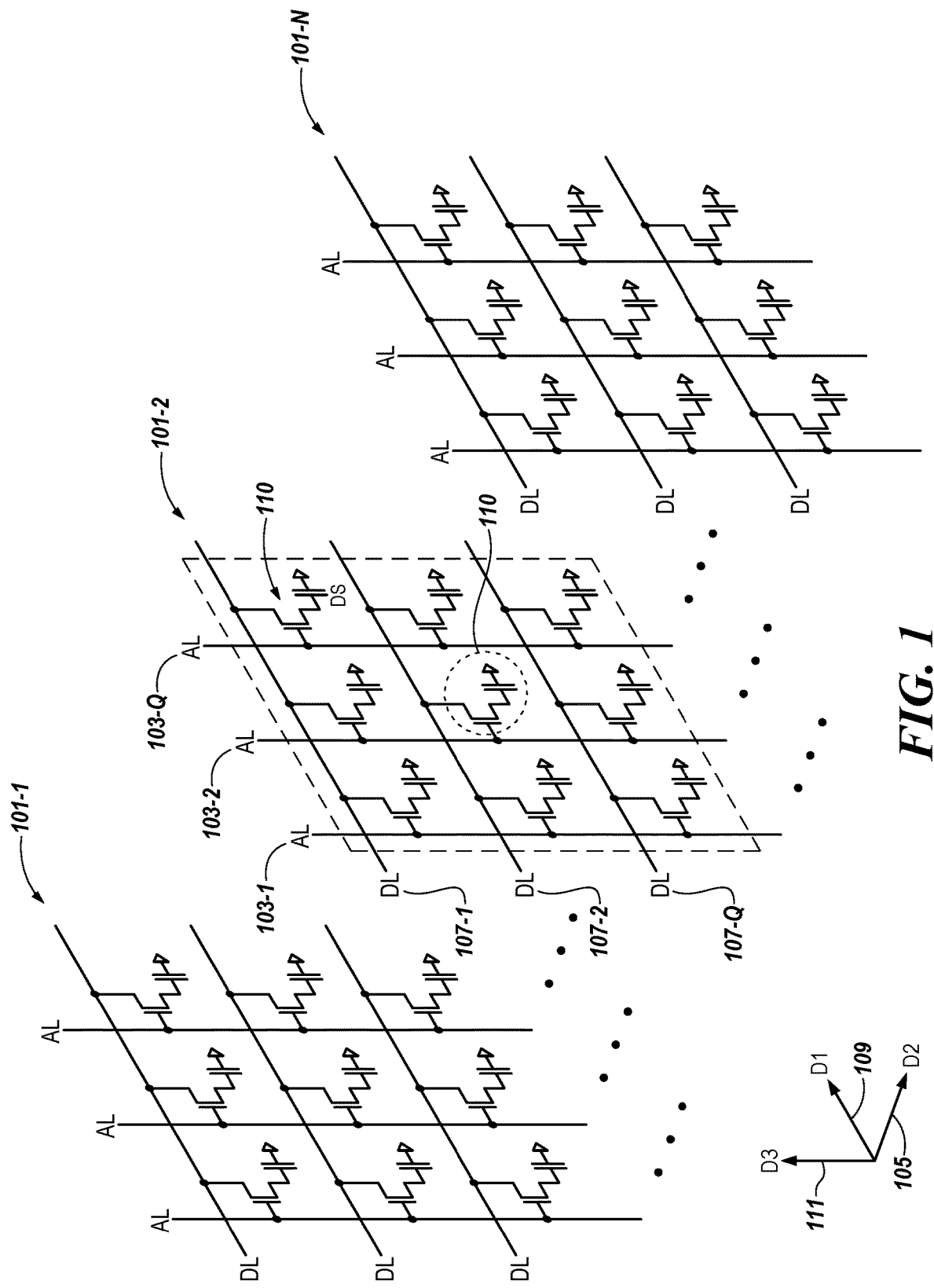
FIG. 1 is a schematic illustration of a vertical three dimensional (3D) memory in accordance a number of embodiments of the present disclosure.

Embodiments of the present disclosure describe a digit line and body contact for semiconductor devices. A digit line and body contact are formed with horizontal access devices in an array of vertically stacked memory cells. The horizontal access devices are integrated with vertically oriented access lines and integrated with horizontally oriented digit lines. The body contact may be formed to provide better body bias control to a body region of the horizontally oriented access device, e.g., transistor. This further provides better access device channel control to a silicon-oxide channel access device and device refresh improvement. A vertically oriented body contact line is integrated to form the body contact to the body region of the horizontally oriented access device.

According to embodiments, the digit line may be better isolated from the body contact line resulting in lower digit line capacitance and less capacitive coupling with the body contact line. The isolation techniques further reduce potential dopant diffusion to a source/drain and digit line contact with potentially more uniform and lower digit line contact resistance and lower source/drain doping requirements.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIG. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1 is a block diagram of an apparatus in accordance a number of embodiments of the present disclosure. FIG. 1 illustrates a circuit diagram showing a cell array of a three dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 103-1, 103-2, . . . , 103-Q (which also may be referred to a wordlines). Also, each of the sub cell arrays, e.g., sub cell array 101-2, may include a plurality of digit lines 107-1, 107-2, . . . , 107-P (which also may be referred to as bitlines, data lines, or sense lines). In FIG. 1, the digit lines 107-1, 107-2, . . . , 107-P are illustrated extending in a first direction (D1) 109 and the access lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 103-1, 103-2, . . . , 103-Q and each digit line 107-1, 107-2, . . . , 107-P. Memory cells may be written to, or read from, using the access lines 103-1, 103-2, . . . , 103-Q and digit lines 107-1, 107-2, . . . , 107-P. The digit lines 107-1, 107-2, . . . , 107-P may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-, 101-2, . . . , 101-N. One memory cell, e.g. 110, may be located between one access line, e.g., 103-2, and one digit line, e.g., 107-2. Each memory cell may be uniquely addressed through a combination of an access line 103-1, 103-2, . . . , 103-Q and a digit line 107-1, 107-2, . . . , 107-P.

The digit lines 107-1, 107-2, . . . , 107-P may be or include conducting patterns (e.g., metal lines) disposed on and spaced apart from a substrate. The digit lines 107-1, 107-2, . . . , 107-P may extend in a first direction (D1) 109. The digit lines 107-1, 107-2, . . . , 107-P in one sub cell array, e.g., 101-2, may be spaced apart from each other in a vertical direction, e.g., in a third direction (D3) 111.

The access lines 103-1, 103-2, . . . , 103-Q may be or include conductive patterns (e.g., metal lines) extending in a vertical direction with respect to the substrate, e.g., in a third direction (D3) 111. The access lines in one sub cell array, e.g., 101-2, may be spaced apart from each other in the first direction (D1) 109.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2:
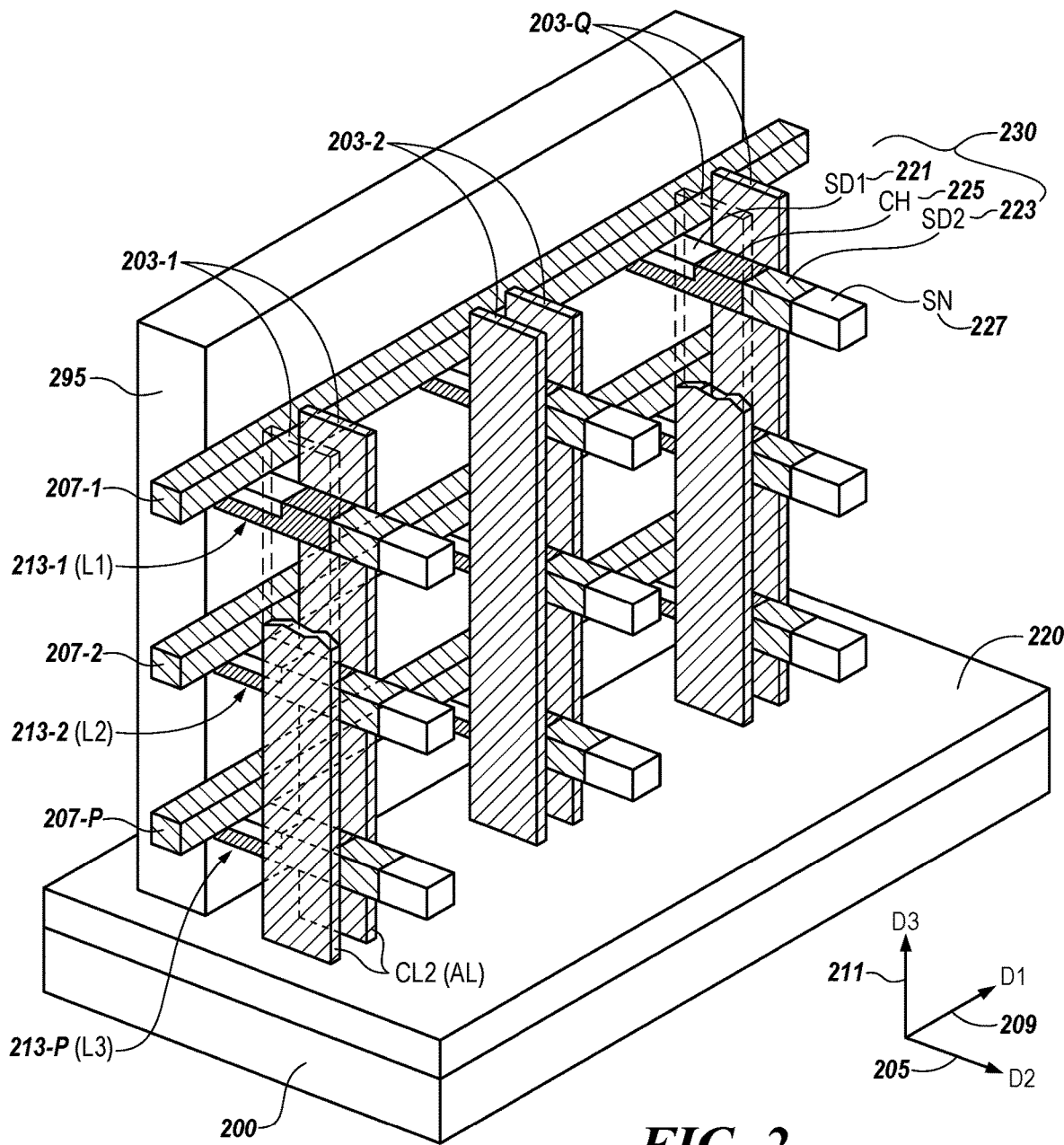
FIG. 2 is a perspective view illustrating a portion of a digit line and body contact for semiconductor devices in accordance with a number of embodiments of the present disclosure.
Figure 3:
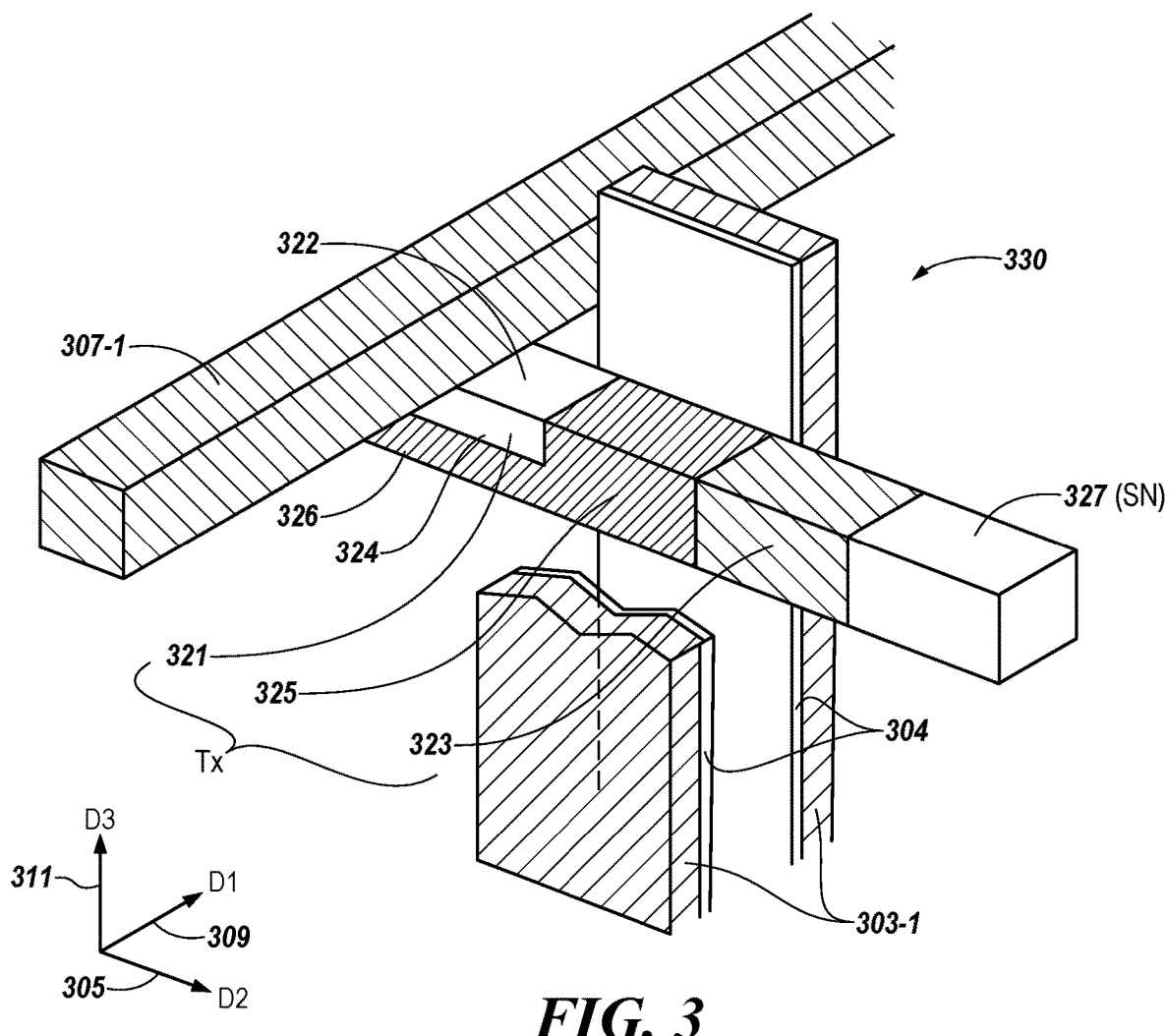
FIG. 3 is a perspective view illustrating a portion of a digit line and body contact for semiconductor devices in accordance with a number of embodiments of the present disclosure.

FIG. 2 illustrates a perspective view showing a three dimensional (3D) semiconductor memory device, e.g., a portion of a sub cell array 101-2 shown in FIG. 1 as a vertically oriented stack of memory cells in an array, according to some embodiments of the present disclosure. FIG. 3 illustrates a perspective view showing unit cell, e.g., memory cell 110 shown in FIG. 1, of the 3D semiconductor memory device shown in FIG. 2.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 111. According to some embodiments the vertically oriented stack of memory cells may be fabricated such that each memory cell, e.g., memory cell 110 in FIG. 1, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1, and may be separated from the substrate 200 by an insulator material 220. Each of the repeating, vertical levels, L1, L2, and L3 may include a plurality of discrete components, e.g., regions, to the laterally oriented access devices 230, e.g., transistors, and storage nodes, e.g., capacitors, including access line 103-1, 103-2, . . . , 103-Q connections and digit line 107-1, 107-2, . . . , 107-P connections. The plurality of discrete components to the laterally oriented access devices 230, e.g., transistors, may be formed in a plurality of iterations of vertically, repeating layers within each level, as described in more detail below in connection with FIGS. 4A-4K, and may extend horizontally in the second direction (D2) 205, analogous to second direction (D2) 105 shown in FIG. 1.

The plurality of discrete components to the laterally oriented access devices 230, e.g., transistors, may include a first source/drain region 221 and a second source/drain region 223 separated by a channel region 225, extending laterally in the second direction (D2) 205, and formed in a body of the access devices. In some embodiments, the channel region 225 may include silicon, germanium, silicongermanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in FIG. 2, the storage node 227, e.g., capacitor may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented digit lines 207-1, 207-2, . . . , 207-P extend in the first direction (D1) 209, analogous to the first direction (D1) 109 in FIG. 1. The plurality of horizontally oriented digit lines 207-1, 207-2, . . . , 207-P may be analogous to the digit lines 107-1, 107-2, . . . , 107-P shown in FIG. 1. The plurality of horizontally oriented digit lines 207-1, 207-2, . . . , 207-P may be arranged, e.g., "stacked", along the third direction (D3) 211. The plurality of horizontally oriented digit lines 207-1, 207-2, . . . , 207-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-P, the horizontally oriented memory cells, e.g., memory cell 110 in FIG. 1, may be spaced apart from one another horizontally in the first direction (D1) 209. However, as described in more detail below in connection with FIG. 4 et. Seq., the plurality of discrete components to the laterally oriented access devices 230, e.g., first source/drain region 221 and second source/drain region 223 separated by a channel region 225, extending laterally in the second direction (D2) 205, and the plurality of horizontally oriented digit lines 207-1, 207-2, . . . , 207-P extending laterally in the first direction (D1) 209, may be formed within different vertical layers within each level. For example, the plurality of horizontally oriented digit lines 207-1, 207-2, . . . , 207-P, extending in the first direction (D1) 209, may be disposed on, and in electrical contact with, top surfaces of first source/drain regions 221 and orthogonal to laterally oriented access devices 230, e.g., transistors, extending in laterally in the second direction (D2) 205. In some embodiments, the plurality of horizontally oriented digit lines 207-1, 207-2, . . . , 207-P, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel region 225, of the laterally oriented access device are formed. In some embodiments, the plurality of horizontally oriented digit lines 207-1, 207-2, . . . , 207-P, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200, e.g., in a third direction (D3) 211. Further, as shown in FIG. 2, the access lines, 203-1, 203-2, . . . , 203-Q, in one sub cell array, e.g., sub cell array 101-2 in FIG. 1, may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230, e.g., transistors, extending laterally in the second direction (D2) 205, but adjacent to each other on a level, e.g., first level (L1), in the first direction (D1) 209. Each of the access lines, 203-1, 203-2, . . . , 203-Q, may vertically extend, in the third direction (D3), on sidewalls of respective ones of the plurality of laterally oriented access devices 230, e.g., transistors, that are vertically stacked.

For example, and as shown in more detail in FIG. 3, a first one of the vertically extending access lines, e.g., 203-1, may be adjacent a sidewall of a channel region 225 to a first one of the laterally oriented access devices 230, e.g., transistors, in the first level (L1) 213-1, a sidewall of a channel region 225 of a first one of the laterally oriented access devices 230, e.g., transistors, in the second level (L2) 213-2, and a sidewall of a channel region 225 a first one of the laterally oriented access devices 230, e.g., transistors, in the third level (L3) 213-P, etc. Similarly, a second one of the vertically extending access lines, e.g., 203-2, may be adjacent a sidewall to a channel region 225 of a second one of the laterally oriented access devices 230, e.g., transistors, in the first level (L1) 213-1, spaced apart from the first one of laterally oriented access devices 230, e.g., transistors, in the first level (L1) 213-1 in the first direction (D1) 209. And the second one of the vertically extending access lines, e.g., 203-2, may be adjacent a sidewall of a channel region 225 of a second one of the laterally oriented access devices 230, e.g., transistors, in the second level (L2) 213-2, and a sidewall of a channel region 225 of a second one of the laterally oriented access devices 230, e.g., transistors, in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to wordlines (WL) described in connection with FIG. 1.

As shown in the example embodiment of FIG. 2, a conductive body contact 295 may be formed extending in the first direction (D1) 209 along an end surface of the laterally oriented access devices 230, e.g., transistors, in each level (L1) 213-1, (L2) 213-2, and (L3) 213-P above the substrate 200. The body contact 295 may be connected to a body (as shown by 336 in FIG. 3) e.g., body region, of the laterally oriented access devices 230, e.g., transistors, in each memory cell, e.g., memory cell 110 in FIG. 1. The body contact 295 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3, the first and the second source/drain regions, 321 and 323, may be impurity doped regions to the laterally oriented access devices 330, e.g., transistors. The first and the second source/drain regions, 321 and 323, may be analogous to the first and the second source/drain regions 221 and 223 shown in FIG. 2. The first and the second source/drain regions may be separated by a channel 325 formed in a body of semiconductor material, e.g., body region 326, of the laterally oriented access devices 330, e.g., transistors. The first and the second source/drain regions, 321 and 323, may be formed from an n-type or p-type dopant doped in the body region 326. Embodiments are not so limited.

For example, for an n-type conductivity transistor construction the body region 326 of the laterally oriented access devices 330, e.g., transistors, may be formed of a low doped (p−) p-type semiconductor material. In one embodiment, the body region 326 and the channel 325 separating the first and the second source/drain regions, 321 and 323, may include a low doped, p-type (e.g., low dopant concentration (p−)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of Phosphorus (P) atoms deposited therein. Embodiments, however, are not limited to this example. In other embodiments, the laterally oriented access devices 330, e.g., transistors, may be of a p-type conductivity construction in which case the impurity, e.g., dopant, conductivity types would be reversed.

As shown in the example embodiment of FIG. 3, the first source/drain region 321 may occupy an upper portion in the body 326 of the laterally oriented access devices 330, e.g., transistors. For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321 and is in electrical contact with the body contact, e.g., 295 shown in FIG. 2. Further, as shown in the example embodiment of FIG. 3, a digit line, e.g., 307-1, analogous to the digit lines 207-1, 207-2, . . . , 207-P in FIGS. 2 and 107-1, 107-2, . . . , 107-P shown in FIG. 1, may disposed on a top surface 322 of the first source/drain region 321 and electrically coupled thereto.

As shown in the example embodiment of FIG. 3, an access line, e.g., 303-1, analogous to the access lines 203-1, 203-2, . . . , 203-Q in FIGS. 2 and 103-1, 103-2, . . . , 103-Q in FIG. 1, may be vertically extending in the third direction (D3) 311 adjacent sidewall of the channel region 325 portion of the body 326 to the laterally oriented access devices 330, e.g., transistors horizontally conducting between the first and the second source/drain regions 321 and 323 along the second direction (D2) 305. A gate dielectric material 304 may be interposed between the access line 303-1 (a portion thereof forming a gate to the laterally oriented access devices 330, e.g., transistors) and the channel region 325. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4A:
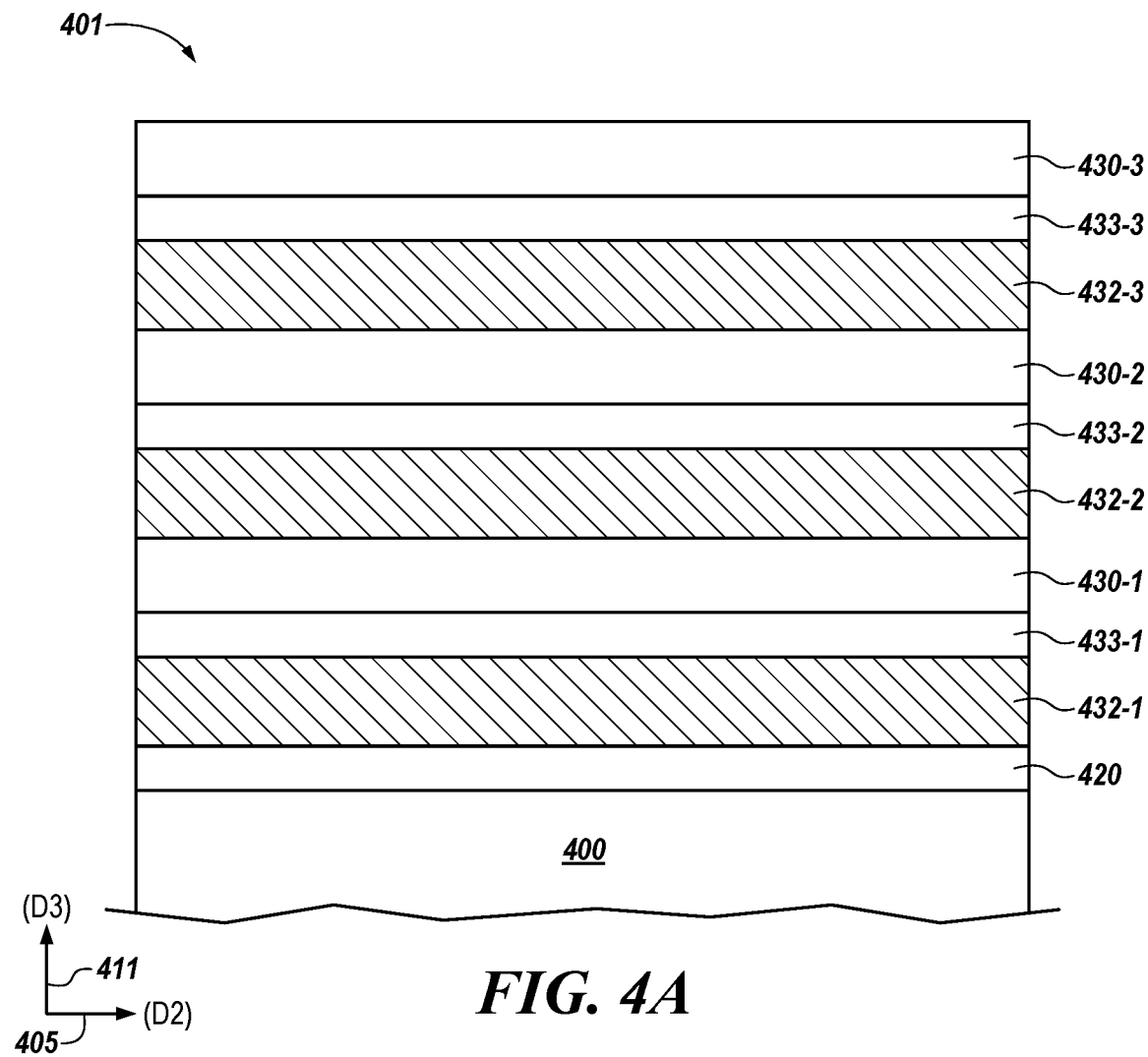
FIG. 4A-4K is a cross-sectional view for forming arrays of vertically stacked memory cells, at multiple stages of a semiconductor fabrication process, to form digit line and body contact for semiconductor devices in accordance with a number of embodiments of the present disclosure.

FIG. 4A is a cross-sectional view, at one stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

In the example embodiment shown in the example of FIG. 4A, the method comprises depositing alternating layers of a first dielectric material, 430-1, 430-2, . . . , 430-N (collectively referred to as first dielectric material 430), a semiconductor material, 432-1, 432-2, . . . , 432-N (collectively referred to as semiconductor material 432), and a second dielectric material, 433-1, 433-2, . . . , 433-N (collectively referred to as second dielectric 433), in repeating iterations to form a vertical stack 401 on a working surface of a semiconductor substrate 400. The alternating materials in the repeating, vertical stack 401 may be separated from the substrate 400 by an insulator material 420. In one embodiment, the first dielectric material 430 can be deposited to have a thickness, e.g., vertical height in the third direction (D3), in a range of twenty (20) nanometers (nm) to sixty (60) nm. In one embodiment, the semiconductor material 432 can be deposited to have a thickness, e.g., vertical height, in a range of twenty (20) nm to one hundred (100) nm. In one embodiment, the second dielectric material 433 can be deposited to have a thickness, e.g., vertical height, in a range of ten (10) nm to thirty (30) nm. Embodiments, however, are not limited to these examples. As shown in FIG. 4, a vertical direction 411 is illustrated as a third direction (D3), e.g., z-direction in an x-y-z coordinate system, analogous to the third direction (D3), among first, second and third directions, shown in FIGS. 1-3.

In some embodiments, the first dielectric material, 430-1, 430-2, . . . , 430-N, may be an interlayer dielectric (ILD). By way of example, and not by way of limitation, the first dielectric material, 430-1, 430-2, . . . , 430-N, may comprise an oxide material, e.g., $SiO_2$. In another example the first dielectric material, 430-1, 430-2, . . . , 430-N, may comprise a silicon nitride ($Si_3N_4$) material (also referred to herein as "SiN"). In another example the first dielectric material, 430-1, 430-2, . . . , 430-N, may comprise a silicon oxy-carbide ($SiO_xC_y$) material. In another example the first dielectric material, 430-1, 430-2, . . . , 430-N, may include silicon oxy-nitride ($SiO_xN_y$) material (also referred to herein as "SiON"), and/or combinations thereof. Embodiments are not limited to these examples.

In some embodiments the semiconductor material, 432-1, 432-2, . . . , 432-N, may comprise a silicon (Si) material in a polycrystalline and/or amorphous state. The semiconductor material, 432-1, 432-2, . . . , 432-N, may be a low doped, p-type (p−) silicon material. The semiconductor material, 432-1, 432-2, . . . , 432-N, may be formed by gas phase doping boron atoms (B), as an impurity dopant, at a low concentration to form the low doped, p-type (p−) silicon material. The low doped, p-type (p−) silicon material may be a polysilicon material. Embodiments, however, are not limited to these examples.

In some embodiments, the second dielectric material, 433-1, 433-2, . . . , 433-N, may be an interlayer dielectric (ILD). By way of example, and not by way of limitation, the second dielectric material, 433-1, 433-2, . . . , 433-N, may comprise a nitride material. The nitride material may be a silicon nitride ($Si_3N_4$) material (also referred to herein as "SiN"). In another example the second dielectric material, 433-1, 433-2, . . . , 433-N, may comprise a silicon oxy-carbide (SiOC) material. In another example the second dielectric material, 433-1, 433-2, . . . , 433-N, may include silicon oxy-nitride (SiON), and/or combinations thereof. Embodiments are not limited to these examples. However, according to embodiments, the second dielectric material, 433-1, 433-2, . . . , 433-N, is purposefully chosen to be different in material or composition than the first dielectric material, 430-1, 430-2, . . . , 430-N, such that a selective etch process may be performed on one of the first and second dielectric layers, selective to the other one of the first and the second dielectric layers, e.g., the second SiN dielectric material, 433-1, 433-2, . . . , 433-N, may be selectively etched relative to the semiconductor material, 432-1, 432-2, . . . , 432-N, and a first oxide dielectric material, 430-1, 430-2, . . . , 430-N.

The repeating iterations of alternating first dielectric material, 430-1, 430-2, . . . , 430-N layers, semiconductor material, 432-1, 432-2, . . . , 432-N layers, and second dielectric material, 433-1, 433-2, . . . , 433-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a first dielectric material, a semiconductor material, and a second dielectric material, in repeating iterations to form the vertical stack 401.

The layers may occur in repeating iterations vertically. In the example of FIG. 4A, three tiers, numbered 1, 2, and 3, of the repeating iterations are shown. For example, the stack may include: a first dielectric material 430-1, a semiconductor material 432-1, a second dielectric material 433-1, a third dielectric material 430-2, a second semiconductor material 432-2, a fourth dielectric material 433-2, a fifth dielectric material 430-3, a third semiconductor material 432-3, and a sixth dielectric material 433-3. As such, a stack may include: a first oxide material 430-1, a first semiconductor material 432-1, a first nitride material 433-1, a second oxide material 430-2, a second semiconductor material 432-2, a second nitride material 433-2, a third oxide material 430-3, a third semiconductor material 432-3, and a third nitride material 433-3 in further repeating iterations. Embodiments, however, are not limited to this example and more or fewer repeating iterations may be included.

Figure 4B:
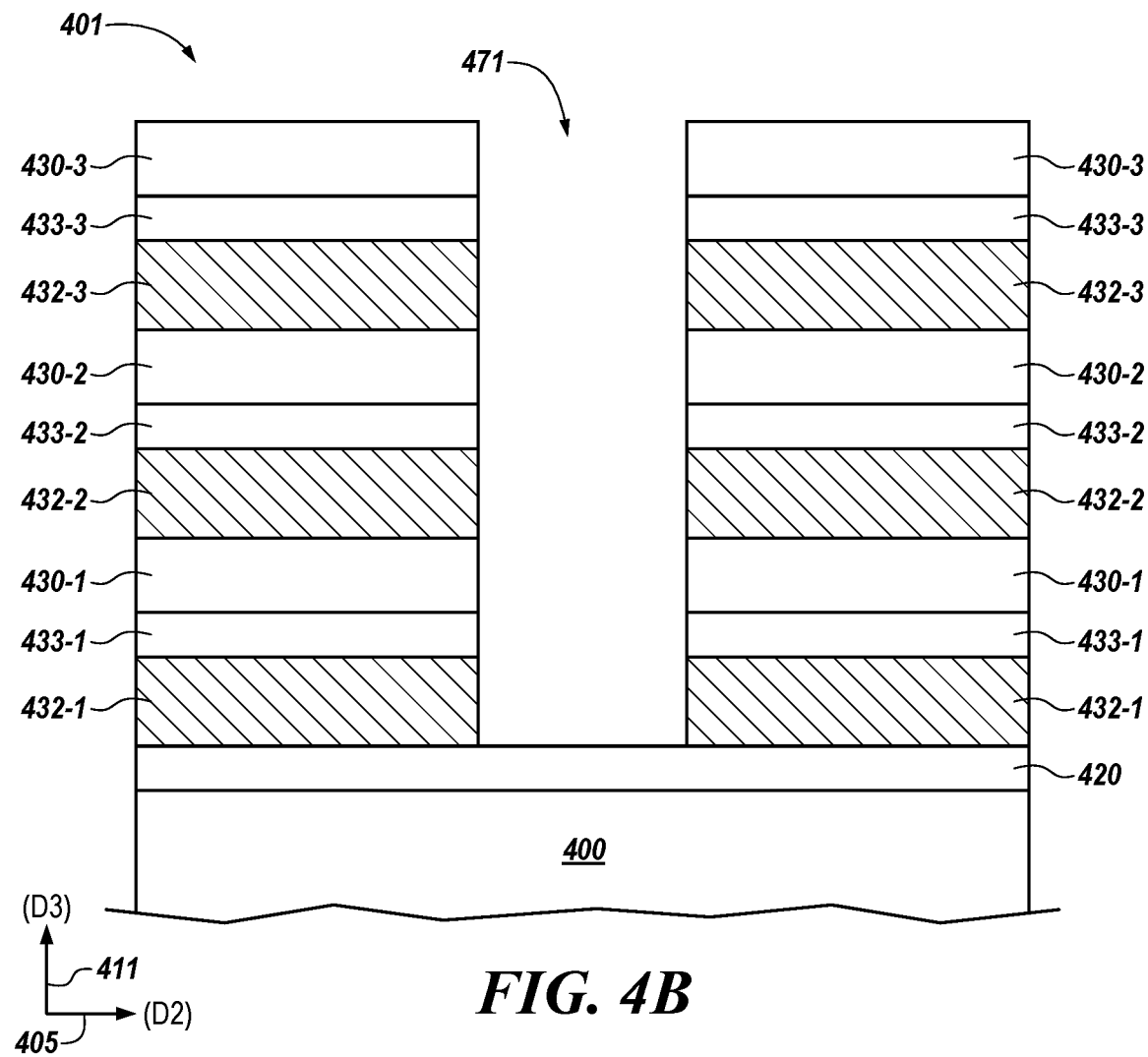

FIG. 4B is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

According to embodiments, the semiconductor fabrication process described in FIGS. 4B-4K can occur after an elongated pillar extending in the second direction and access line formation such as shown in FIGS. 5A-6E have been performed.

As shown in FIG. 4B, a vertical opening 471 may be formed through the layers within the vertically stacked memory cells to expose vertical sidewalls in the vertical stack. The vertical opening 471 may be formed through the repeating iterations of the oxide material 430, the semiconductor material 432, and the nitride material 433. As such, the vertical opening 471 may be formed through the first oxide material 430-1, the first semiconductor material 432-1, the first nitride material 433-1, the second oxide material 430-2, the second semiconductor material 432-2, the second nitride material 433-2, the third oxide material 430-3, the third semiconductor material 432-3, and the third nitride material 433-3. Embodiments, however, are not limited to the single vertical opening shown in FIG. 4B. Multiple vertical openings may be formed through the layers of materials. The vertical opening 471 may be formed to expose vertical sidewalls in the vertical stack.

Figure 4C:
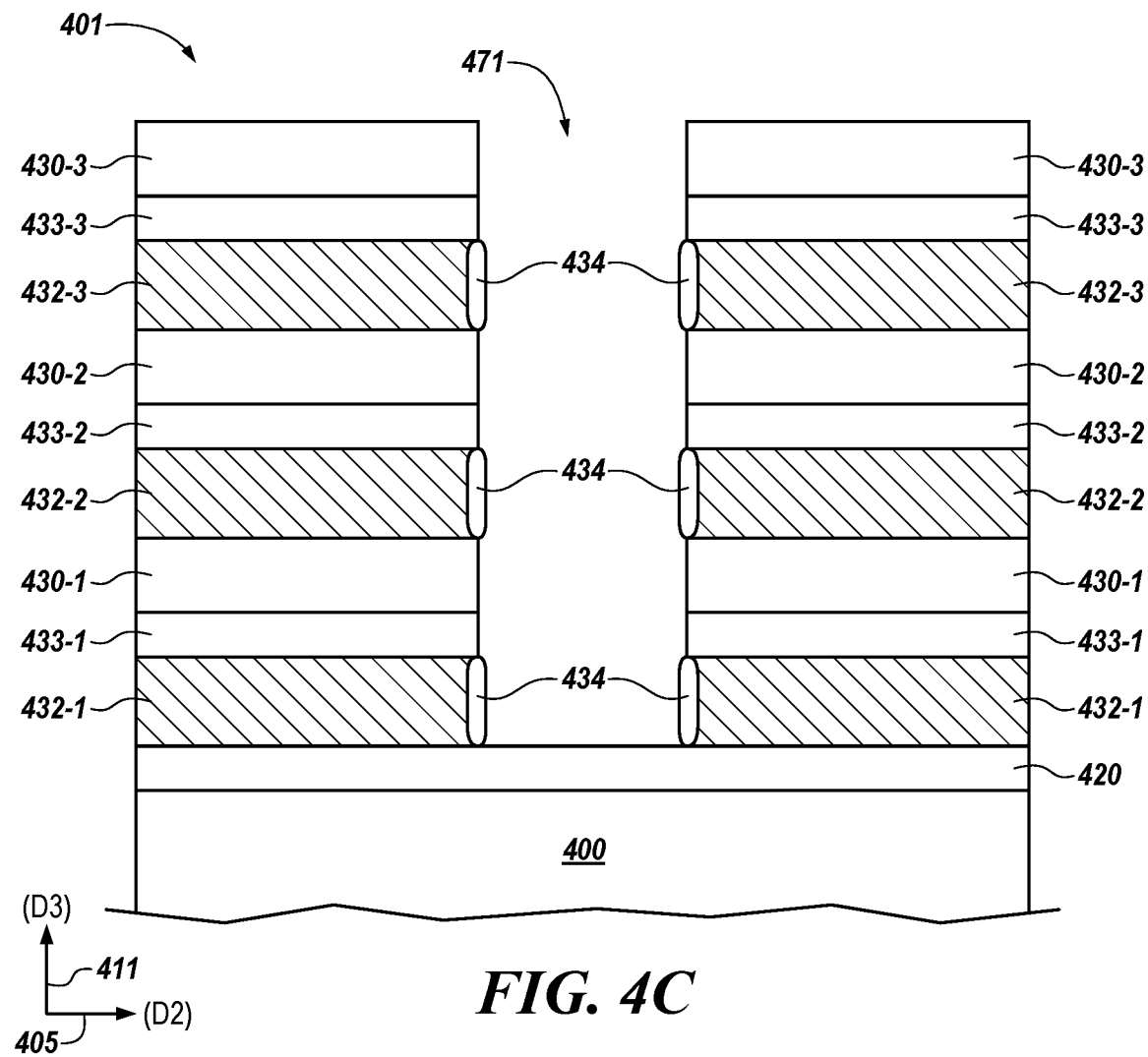

FIG. 4C is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

An etchant may be flowed into the vertical opening 471 to selectively etch the second dielectric material 433. For example, an etchant may be flowed into the vertical opening 471 to selectively etch the nitride material 433. The etchant may target all iterations of the second dielectric material 433 within the stack. As such, the etchant may target the first nitride material 433-1, the second nitride material 433-2, and the third nitride material 433-3 within the stack.

The selective etchant process may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) ($O_2/SO_2$) may be utilized. A dry etch chemistries of $O_2$ or of $O_2$ and nitrogen ($N_2$) ($O_2/N_2$) may be used to selectively etch the second dielectric material 433. Alternatively, or in addition, a selective etch to remove the second dielectric material 433 may comprise a selective etch chemistry of phosphoric acid ($H_3PO_4$) or hydrogen fluoride (HF) and/or dissolving the second dielectric material 433 using a selective solvent, for example $NH_4OH$ or HF, among other possible etch chemistries or solvents. The etchant process may cause an oxidization of only the nitride material 433. As shown in the example of FIG. 4C, the etchant process may form a protective oxide coating, e.g., second oxide material 434, on the semiconductor material 432. Hence, the first dielectric material 430 and the semiconductor material 432 may be left intact during the selective etchant process. For example, the selective etchant process may etch a portion of the nitride material 433, while not removing the oxide material 430 and the polysilicon material 432.

As noted, the semiconductor material 432 may be protected by a second oxide material 434 formed on the semiconductor material 432 during the selective etchant process. The second oxide material 434 may be present on all iterations of the semiconductor material 432. For example, the second oxide material 434 may be present on a sidewall to the first semiconductor material 432-1, the second semiconductor material 432-2, and the third semiconductor material 432-3, etc., in the vertical opening 471 within the stack.

Figure 4D:
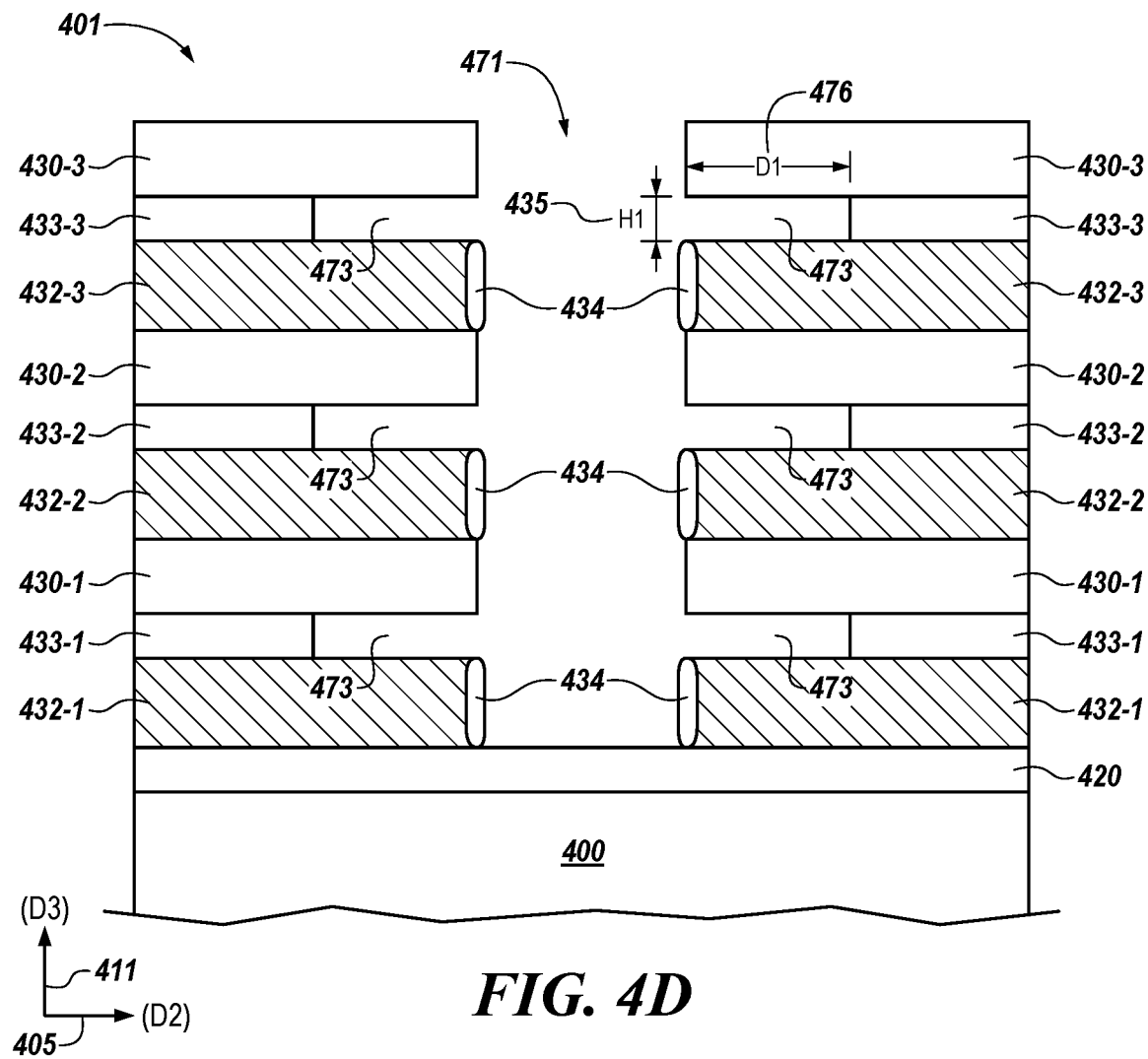

FIG. 4D is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

The selective etchant process may etch the nitride material 433 to form a first horizontal opening 473. The selective etchant process may be performed such that the first horizontal opening 473 has a length or depth (D1) 476 a first distance 476 from the vertical opening 471. The distance (D1) 476 may be controlled by controlling time, composition of etchant gas, and etch rate of a reactant gas flowed into the vertical opening 471, e.g., rate, concentration, temperature, pressure, and time parameters. As such, the nitride material 433 may be etched a first distance 476 from the vertical opening 471. The selective etch may be isotropic, but selective to the second dielectric material 433, substantially stopping on the first dielectric material 430 and the semiconductor material. Thus, in one example embodiment, the selective etchant process may remove substantially all of the nitride material 433 from a top surface of the semiconductor material 432 to a bottom surface of the first dielectric material, e.g., oxide material, in a layer above while etching horizontally a distance (D1) 476 from the vertical opening 471 between the semiconductor material 432 and the oxide material 430. In this example the horizontal opening 473 will have a height (H1) 435 substantially equivalent to and be controlled by a thickness, to which the second dielectric layer 433, e.g., nitride material, was deposited. Embodiments, however, are not limited to this example. As described herein, the selective etchant process may etch the nitride material 433 to a first distance (D1) 476 and to a height (H1) 435.

Figure 4E:
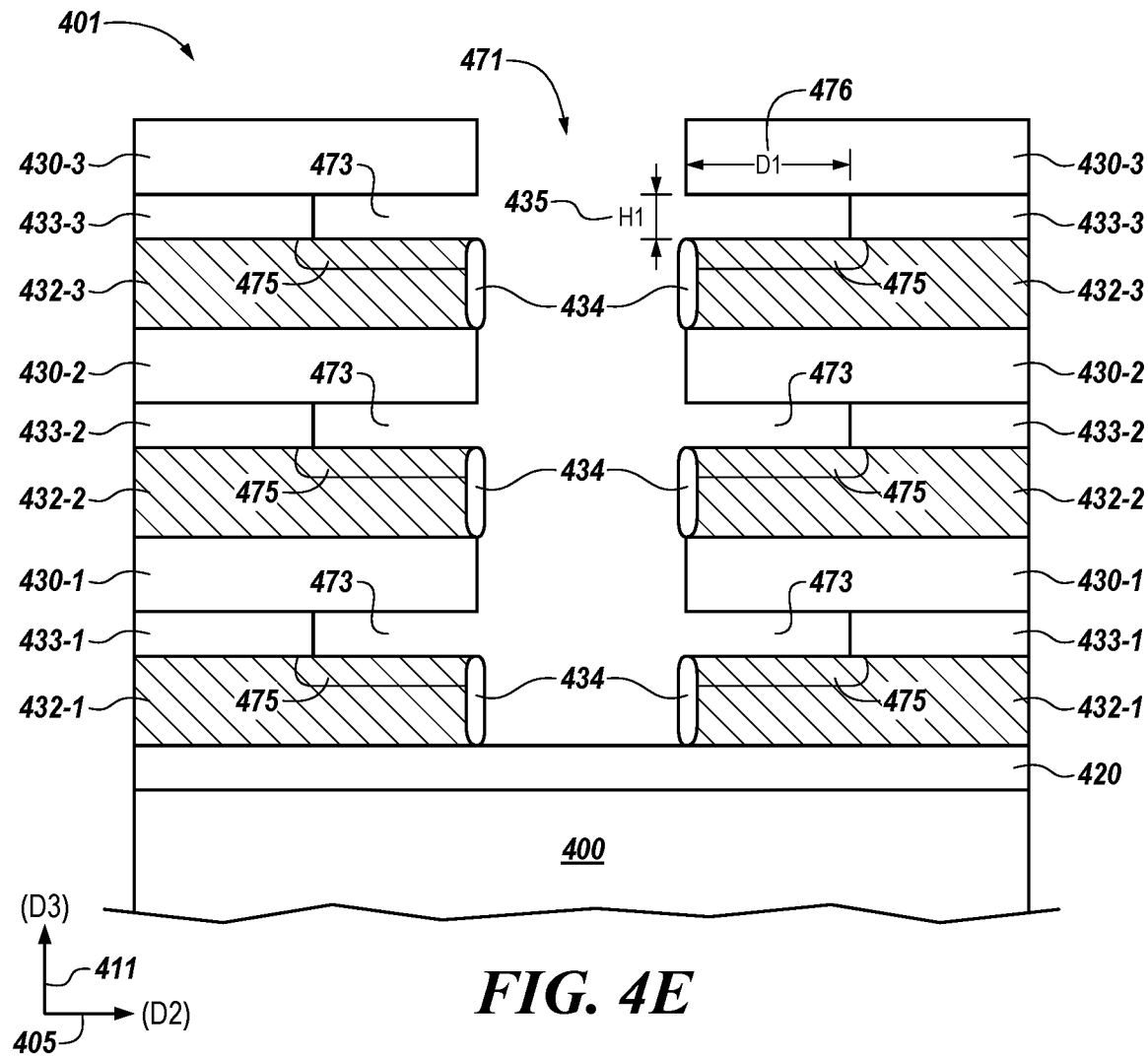

FIG. 4E is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

A first source/drain region 475 may be formed by gas phase doping a dopant into a top surface portion of the semiconductor material 432 via the horizontal opening 473. Gas phase doping may be used to achieve a highly isotropic e.g., non-directional doping. In another example, thermal annealing with doping gas, such as phosphorous may be used with a high energy plasma assist to break the bonding. Embodiments are not so limited and other suitable semiconductor fabrication techniques may be utilized. A width of the first source/drain region 475, doped into the top surface portion of the semiconductor material 432, may be substantially formed all along the first distance (D1) 476 of the first horizontal opening 473 from the vertical opening 471. The source/drain region 475 may be formed by gas phase doping phosphorus (P) atoms, as impurity dopants, at a high plasma energy such as PECVD to form a high concentration, n-type doped (n+) region in the top surface of the semiconductor material 432.

Figure 4F:
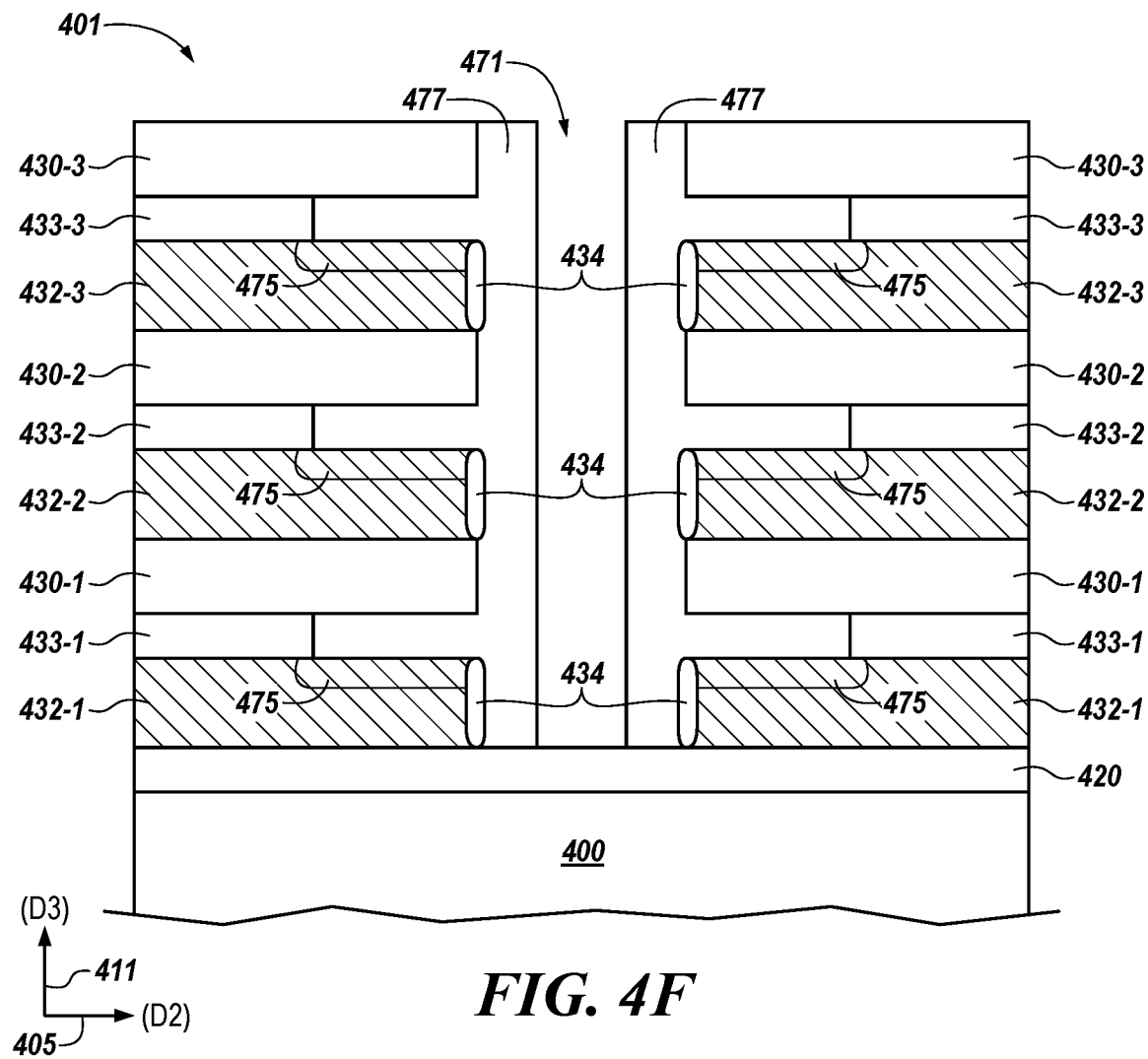

FIG. 4F is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

A conductive material 477 may be conformally deposited into a portion of the vertical opening 471, e.g., using a chemical vapor deposition (CVD) process, such that the conductive material may also be deposited into the first horizontal opening 473. In some embodiments, the conductive material 477 may comprise a titanium nitride (TiN) material. In some embodiments the conductive material 477 may be tungsten (W). In this example, some embodiments may include forming the tungsten (W) material according to a method as described in co-filed, co-pending U.S. patent application Ser. No. 16/943,108, entitled "DIGIT LINE FORMATION FOR HORIZONTALLY ORIENTED ACCESS DEVICES", and having at least one common inventor. The conductive material 477 may form a laterally oriented digit line.

Figure 4G:
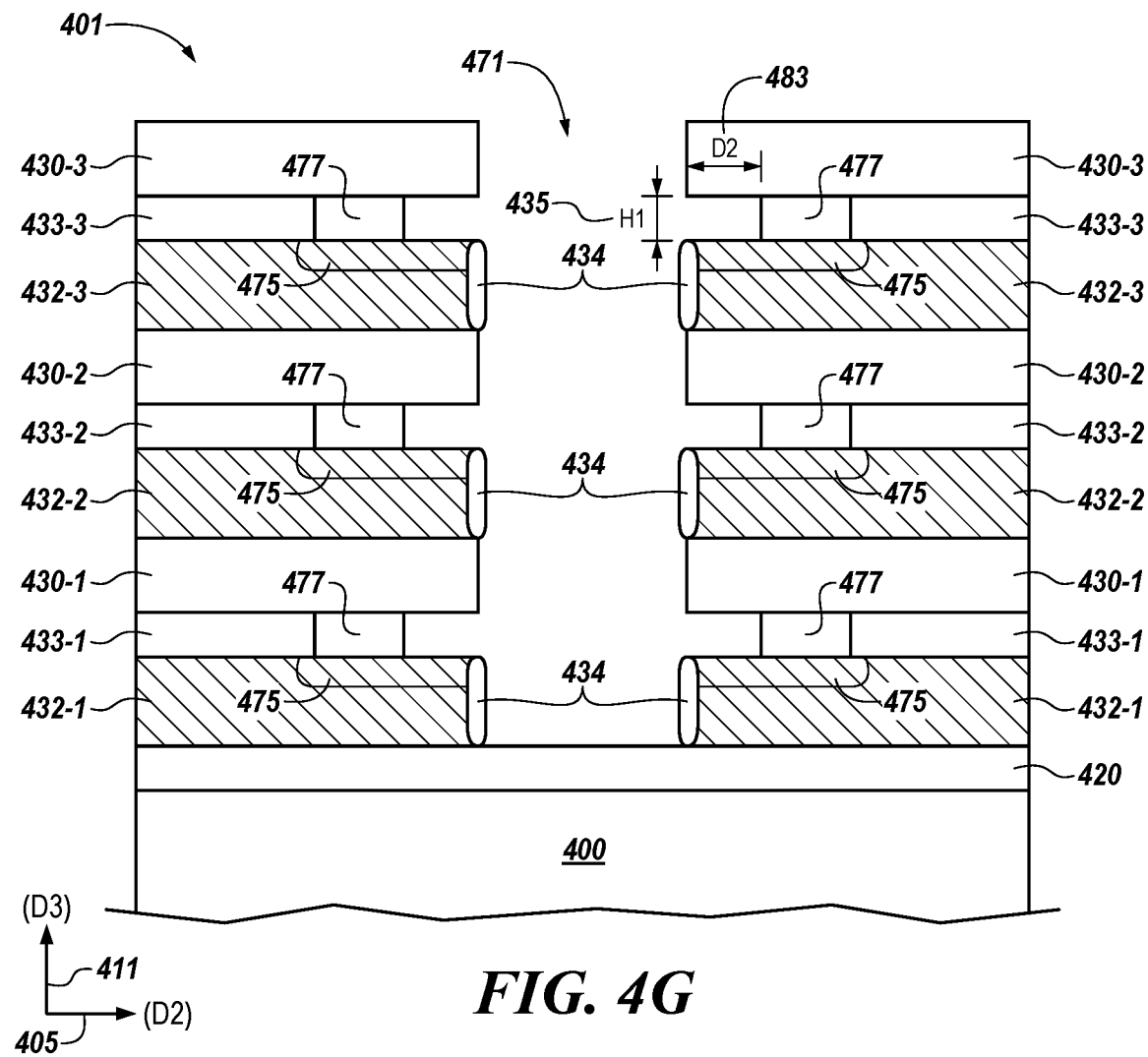

FIG. 4G is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

The conductive material 477 may be recessed back in the horizontal opening 473, e.g., etched away from the vertical opening 471 using an atomic layer etching (ALE) or other suitable technique. In some examples, the conductive material 477 may be etched back in the horizontal opening 473 a second distance (D2) 483 from the vertical opening 471. The conductive material 477 may be selectively etched, leaving the oxide material 430, a portion of the conductive material 477, the semiconductor material 432, and the source/drain region 475 intact. The conductive material 477 may be etched using a third etchant process. In some embodiments, the conductive material 477 may be etched using an atomic layer etching (ALE) process. In some embodiments, the conductive material 477 may be etched using an isotropic etch process. The conductive material 477 may be recessed the second distance (D2) 483 back in the horizontal opening 473 to remain in direct electrical contact on a top surface of the first source/drain region 475 formed in the semiconductor material 432. As such, the conductive material 477 remains in electrical contact with the source/drain region 475 and may form part of an integral, horizontally oriented, conductive digit line, e.g., digit lines 107, 207, and 307 in FIGS. 1-3 respectively.

Figure 4H:
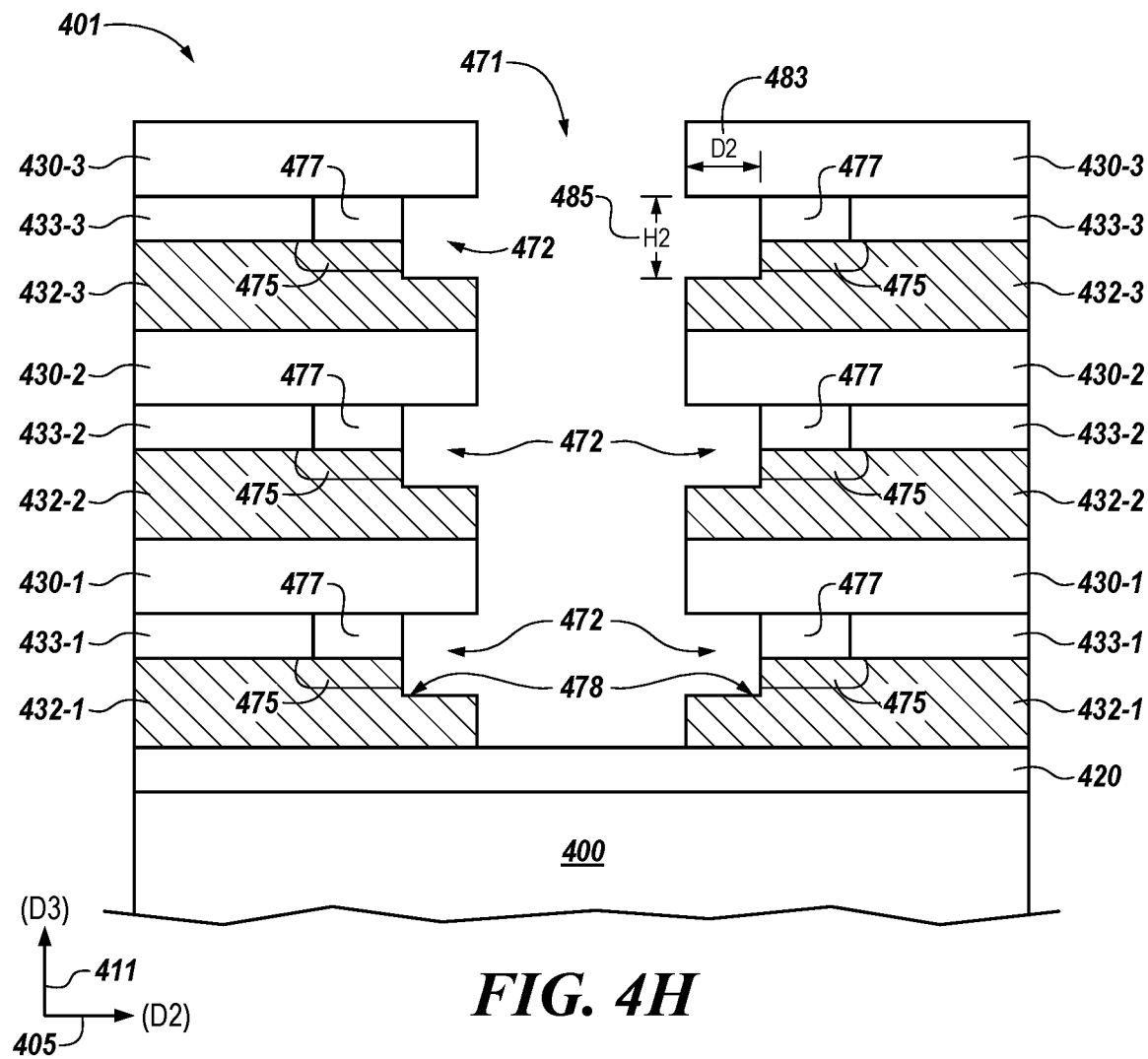

FIG. 4H is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

As shown in FIG. 4H, the oxide material protecting the sidewalls of semiconductor material (illustrated as 434 in FIGS. 4C-4G) in the vertical opening 471, a portion of the first source/drain region 475, and a first portion 478 of the semiconductor material 432 beneath the first source/drain region 475 may be selectively etched away to allow for formation of a body contact to a body region of the horizontal access device. In this example, a portion of the source/drain region 475 and a top portion, e.g., first portion 478, of the semiconductor material 432 beneath the first source/drain region 475 may also be etched back to a second distance (D2) 483 from the vertical opening 471. The etch may be performed using a fourth etchant process, e.g., using an atomic layer etching (ALE) or other suitable technique. In some embodiments, the source/drain region 475 may be etched to the same horizontal distance (D2) 483 from the vertical opening 471 as the conductive material 477.

Thus, a second horizontal opening 472 may be formed by the etching of the portion of the source/drain region 475 and the top surface, e.g., 478, of the semiconductor material 432 beneath the first source/drain region 475 the second horizontal distance (D2) 483 from the vertical opening 471. As such, the second horizontal openings 472 may have a second vertical height (H2) 485. The second vertical height (H2) 485 may be greater, e.g., taller vertically, than a combination of the height (H1) 435 of the first horizontal opening 473 formed in the second dielectric material, e.g., nitride material, and the height, e.g., depth of gas phase doping into the top surface of the semiconductor material 432, of the source/drain region 475. For example, the second height (H2) 485 may also include the height of the top portion, e.g., 478, of the semiconductor material 432 that was etched away. Thus, the second distance (D2) 483 may be shorter that the first distance (D1) 476, but the second height 485 may be taller than the first height (illustrated as H1 in FIGS. 4D-4E).

Figure 4I:
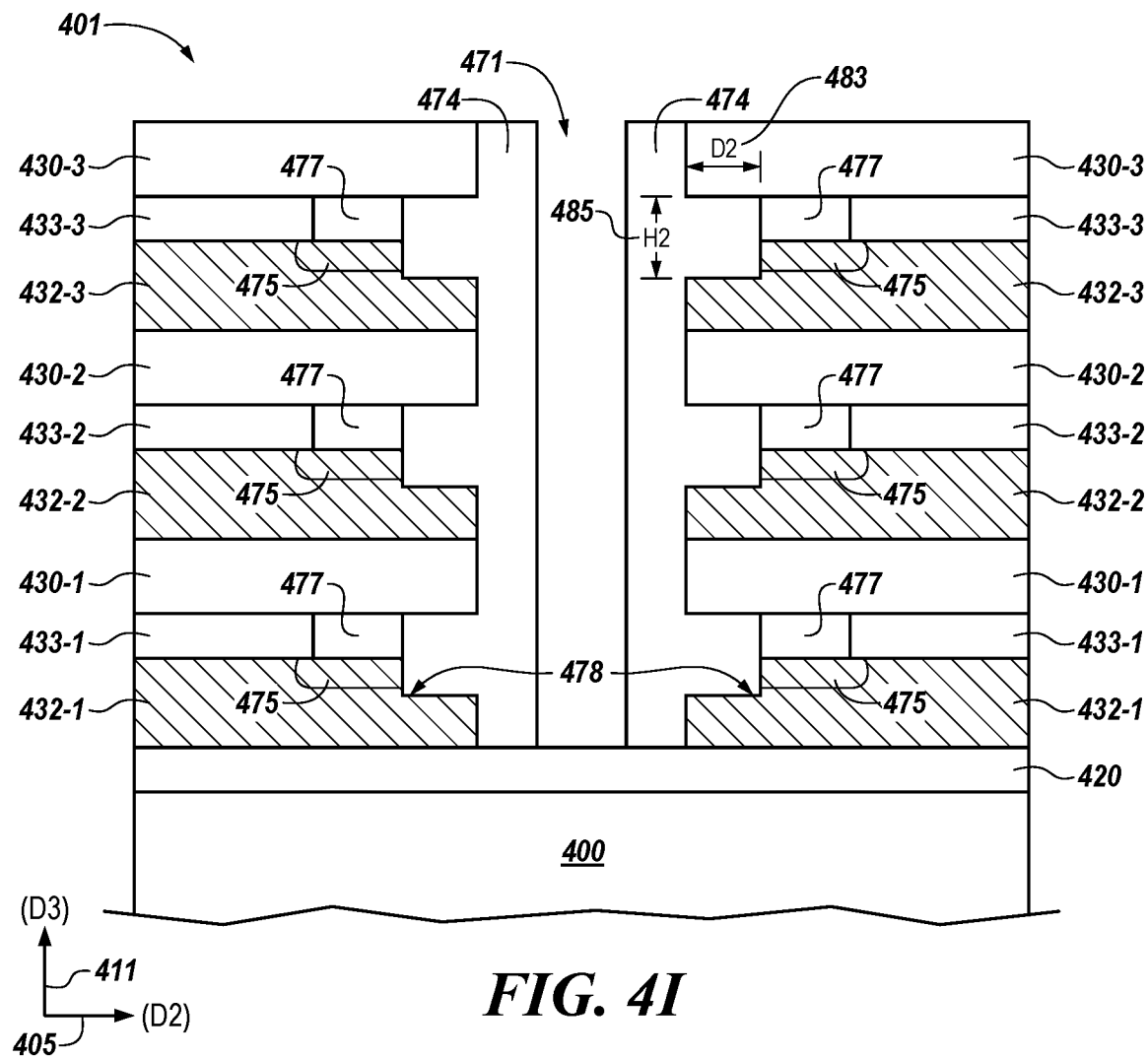

FIG. 4I is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

As shown in FIG. 4I, a third dielectric material 474 is conformally deposited, e.g., using a CVD process, into the vertical opening 471 and may conformally fill the vertical opening 471 the second horizontal opening (illustrated as 472 in FIGS. 4D-4H). The third dielectric material 474 may be horizontally adjacent to the conductive material 477, e.g., horizontal, conductive digit line extending in the first direction (D1) 109 in FIG. 1, the source/drain region 475, and the first portion of the low doped, e.g., p-type, lowed doped (p−), semiconductor material 432. For example, in some embodiments, the third dielectric material 474 may be below the first dielectric material 430 and in direct contact with the conductive material 477, the source/drain region 475, and the first portion of the low doped semiconductor material 432. Embodiments, however, are not limited to this example.

The third dielectric material 474 may be the same material or a different material as the second dielectric material 433. For example, the second dielectric material may be $Si_2N_3$ and the third dielectric material may also be $Si_3N_4$. In another example the third dielectric material 474 may comprise a silicon dioxide ($SiO_2$) material. In another example the third dielectric material 474 may comprise a silicon oxy-carbide ($SiO_xC_y$) material. In another example the third dielectric material 474 may include silicon oxy-nitride ($SiO_xN_y$), and/or combinations thereof. Embodiments are not limited to these examples.

Figure 4J:
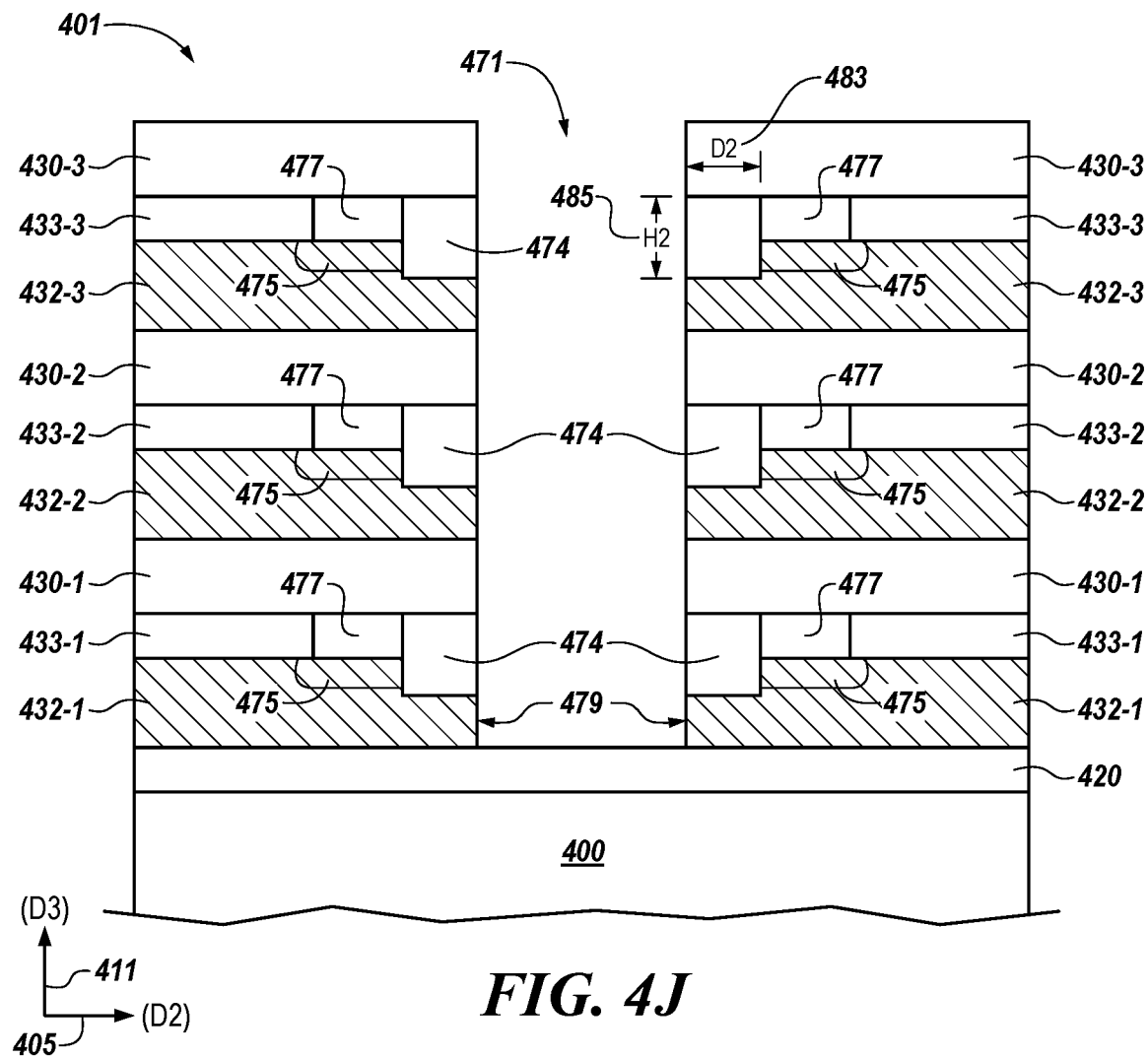

FIG. 4J is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

Figure 9:
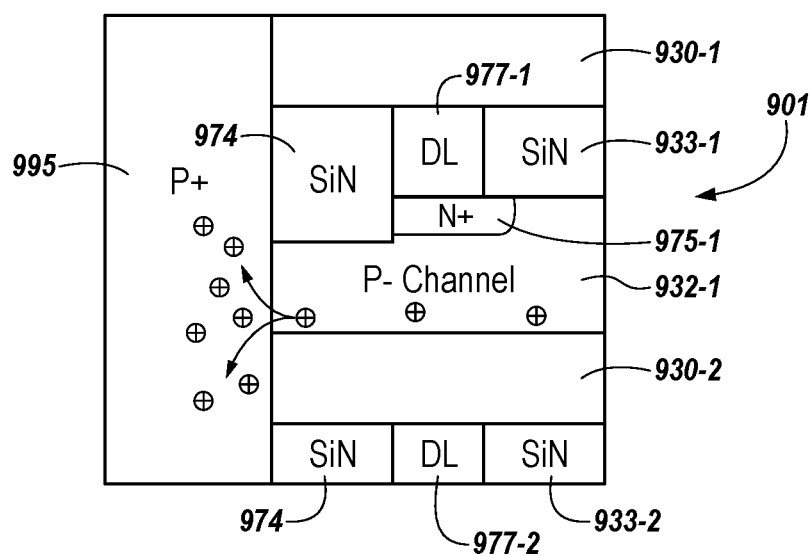
FIG. 9 illustrates cross-sectional view of an example horizontally oriented access device coupled to a horizontally oriented storage node and coupled to vertically oriented access lines and horizontally oriented digit lines, in accordance with a number of embodiments of the present disclosure.

The third dielectric material 474 may be recessed back to remove from the first vertical opening 471 and maintain the first vertical opening 471 to allow for deposition of a conductive material (shown in FIG. 4K) to form a direct, electrical contact between such conductive material deposited within the vertical opening 471 and a second portion 479 of the low doped, e.g., p-type, low doped (p−), semiconductor material 432, e.g., body region contact, of the horizontally oriented access device, e.g., 901 in FIG. 9, within the vertical stack. In some embodiments, the third dielectric material 474 may be etched away from the vertical opening 471 to expose the sidewalls of the first dielectric material 430, the third dielectric material 474, and a second portion 479 of the semiconductor material 432.

Figure 4K:
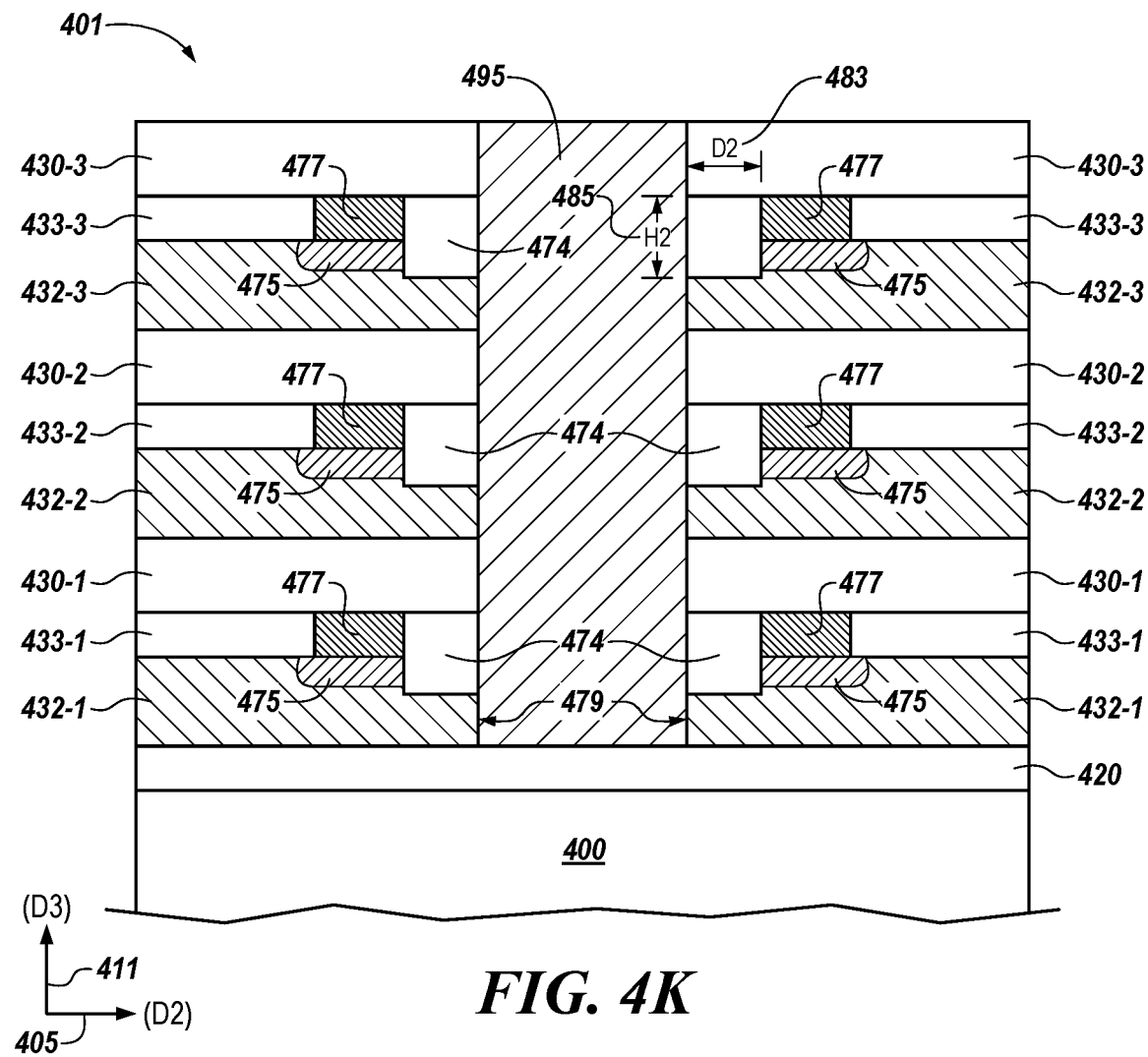

FIG. 4K is a cross-sectional view, at another stage of a semiconductor fabrication process, for forming digit line and body contact for semiconductor devices having horizontally oriented access devices and vertically oriented access lines, such as illustrated in FIGS. 1-3, and in accordance with a number of embodiments of the present disclosure.

As shown in FIG. 4K, a conductive material 495 is deposited into the vertical opening 471 to form a direct, electrical contact with the second portion 479 of the low doped, e.g., p-type, low doped (p−), semiconductor material 432. In some embodiments, the conductive material may be a metal such as tungsten (W). Embodiments, however, are not so limited. In some embodiments, the conductive material 495 is a high doped, e.g., p-type, high doped (p+), semiconductor material which may be deposited into the vertical opening 471. In this example, the high doped semiconductor material 495 may be a high doped, p-type (p+) silicon material. The high doped, p-type (p+) silicon material 495 may be a polysilicon material. In one example, forming the conductive body contact comprises depositing a degenerate semiconductor material. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In some examples, the high doped semiconductor material 495 may be a high doped, p-type (p+) silicon-germanium (SiGe) material. The SiGe material, may be deposited in to the vertical opening 471 at a relatively lower temperature. Embodiments, however, are not limited to these examples. The high doped, p-type (p+) silicon material 495 may form a conductive body contact with the second portion 479 of the semiconductor material 432.

The high doped, p-type (p+) silicon material 495 may reduce holes generated by gate-induced drain leakage (GIDL) during operation of the laterally oriented access devices. The high doped, p-type (p+) silicon material 495 may control channel potential within the semiconductor material 432 by controlling hole formation within the semiconductor material 432. For example, holes formation which may occur between the first source/drain region 475, the high doped (p+) polysilicon material, and a body region of the horizontally oriented access device if the first source/drain region 475 were not electrically isolated from the conductive material 495 by the third dielectric material 474.

Figure 5A:
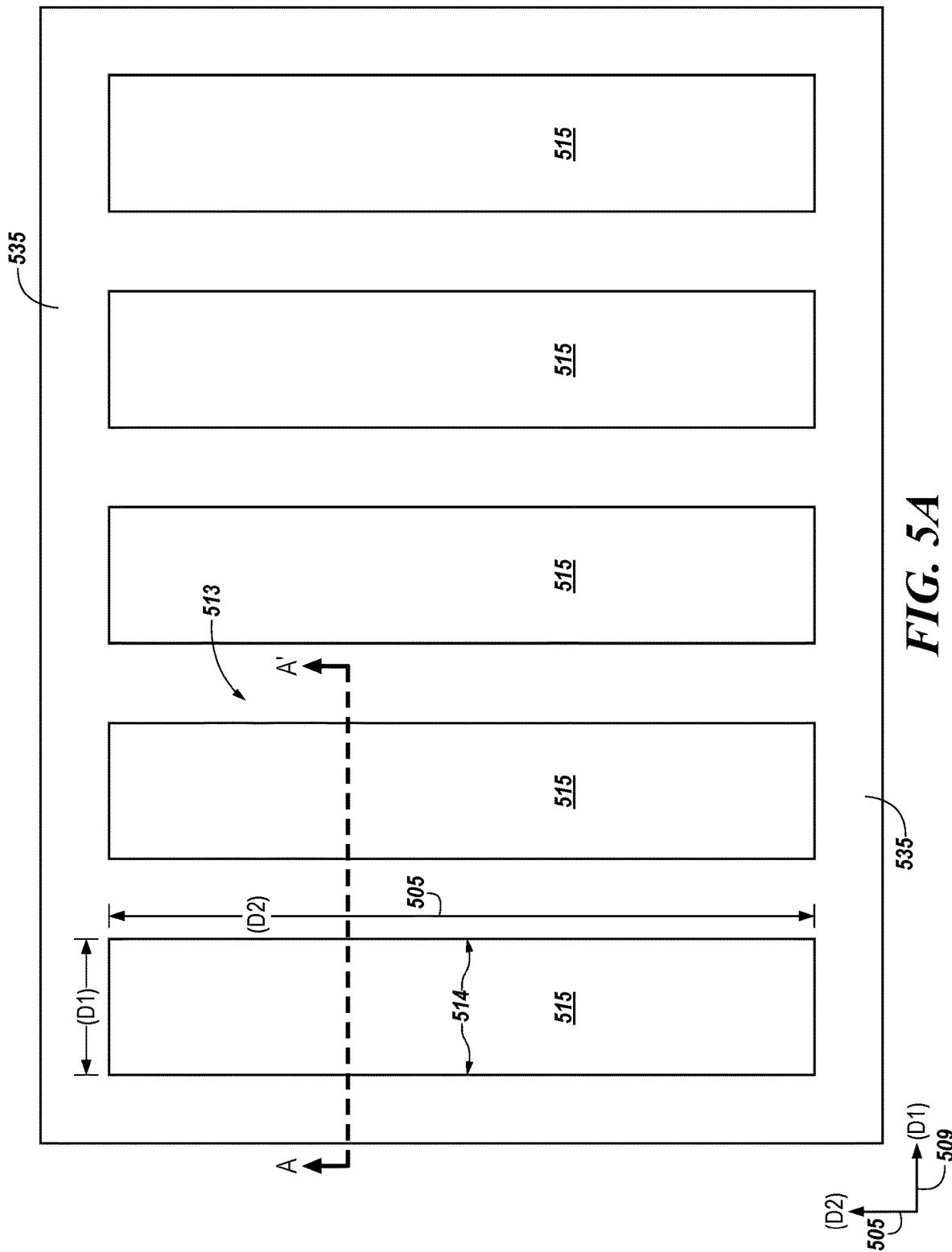

FIG. 5A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of first vertical openings 500, having a first horizontal direction (D1) 509 and a second horizontal direction (D2) 505, through the vertical stack to the substrate. In one example, as shown in FIG. 5A, the plurality of first vertical openings 500 are extending predominantly in the second horizontal direction (D2) 505 and may form elongated vertical, pillar columns 513 with sidewalls 514 in the vertical stack. The plurality of first vertical openings 500 may be formed using photolithographic techniques to pattern a photolithographic mask 535, e.g., to form a hard mask (HM), on the vertical stack prior to etching the plurality of first vertical openings 500.

FIG. 5B is a cross sectional view, taken along cut-line A-A' in FIG. 5A, showing another view of the semiconductor structure at a particular time in the semiconductor fabrication process. The cross sectional view shown in FIG. 5B shows the repeating iterations of alternating layers of a first dielectric material, 530-1, 530-2, . . . , 530-N, a semiconductor material, 532-1, 532-2, . . . , 532-N, and a second dielectric material, 533-1, 533-2, . . . , 533-N, on a semiconductor substrate 500 to form the vertical stack, e.g. 401 as shown in FIG. 4. FIG. 5B illustrates that a conductive material, 540-1, 540-2, . . . , 540-4, may be formed on a gate dielectric material 538 in the plurality of first vertical openings 500. By way of example and not by way of limitation, a gate dielectric material 538 may be conformally deposited in the plurality of first vertical openings 500 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 538 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 538 may comprise a silicon dioxide ($SiO_2$) material, aluminum oxide ($Al_2O_3$) material, high dielectric constant (k), e.g., high-k, dielectric material, and/or combinations thereof as also described in FIG. 3.

Further, as shown in FIG. 5B, a conductive material, 540-1, 540-2, . . . , 540-4, may be conformally deposited in the plurality of first vertical openings 500 on a surface of the gate dielectric material 538. By way of example, and not by way of limitation, the conductive material, 540-1, 540-2, . . . , 540-4, may be conformally deposited in the plurality of first vertical openings 500 on a surface of the gate dielectric material 538 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the gate dielectric 538. The conductive material, 540-1, 540-2, . . . , 540-4, may be conformally deposited to a particular thickness (t2) to form vertically oriented access lines, such as shown as access lines 103-1, 103-2, . . . , 103-Q (which also may be referred to a wordlines) shown in FIG. 1, et. seq., and as suited to a particular design rule. For example, the conductive material, 540-1, 540-2, . . . , 540-4, may be conformally deposited to a thickness of approximately 20 nanometers (nm). Embodiments, however, are not limited to this example. By way of example, and not by way of limitation, the conductive material, 540-1, 540-2, . . . , 540-4, may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof as also described in FIG. 3.

As shown in FIG. 5B, the conductive material, 540-1, 540-2, . . . , 540-4, may be recessed back to remain only along the vertical sidewalls of the elongated vertical, pillar columns, now shown as 542-1, 542-2, and 542-3 in the cross-sectional view of FIG. 5B. The plurality of separate, vertical access lines formed from the conductive material, 540-1, 540-2, . . . , 540-4, may be recessed back by using a suitable selective, anisotropic etch process remove the conductive material, 540-1, 540-2, . . . , 540-4, from a bottom surface of the first vertical openings, e.g., 500 in FIG. 5A, exposing the gate dielectric 538 on the bottom surface to form separate, vertical access lines, 540-1, 540-2, . . . , 540-4. As shown in FIG. 5B, a dielectric material 539, such as an oxide or other suitable spin on dielectric (SOD), may then be deposited in the first vertical openings 500, using a process such as CVD, to fill the first vertical openings 500. The dielectric may be planarized to a top surface of the hard mask 535 of the vertical semiconductor stack, using chemical mechanical planarization (CMP) or other suitable semiconductor fabrication technique. A subsequent photolithographic material 536, e.g., hard mask, may be deposited using CVD and planarized using CMP to cover and close the first vertical openings 500 over the separate, vertical access lines, 540-1, 540-2, . . . , 540-4. Similar semiconductor process techniques may be used at other points of the semiconductor fabrication process described herein.

Figure 6A:
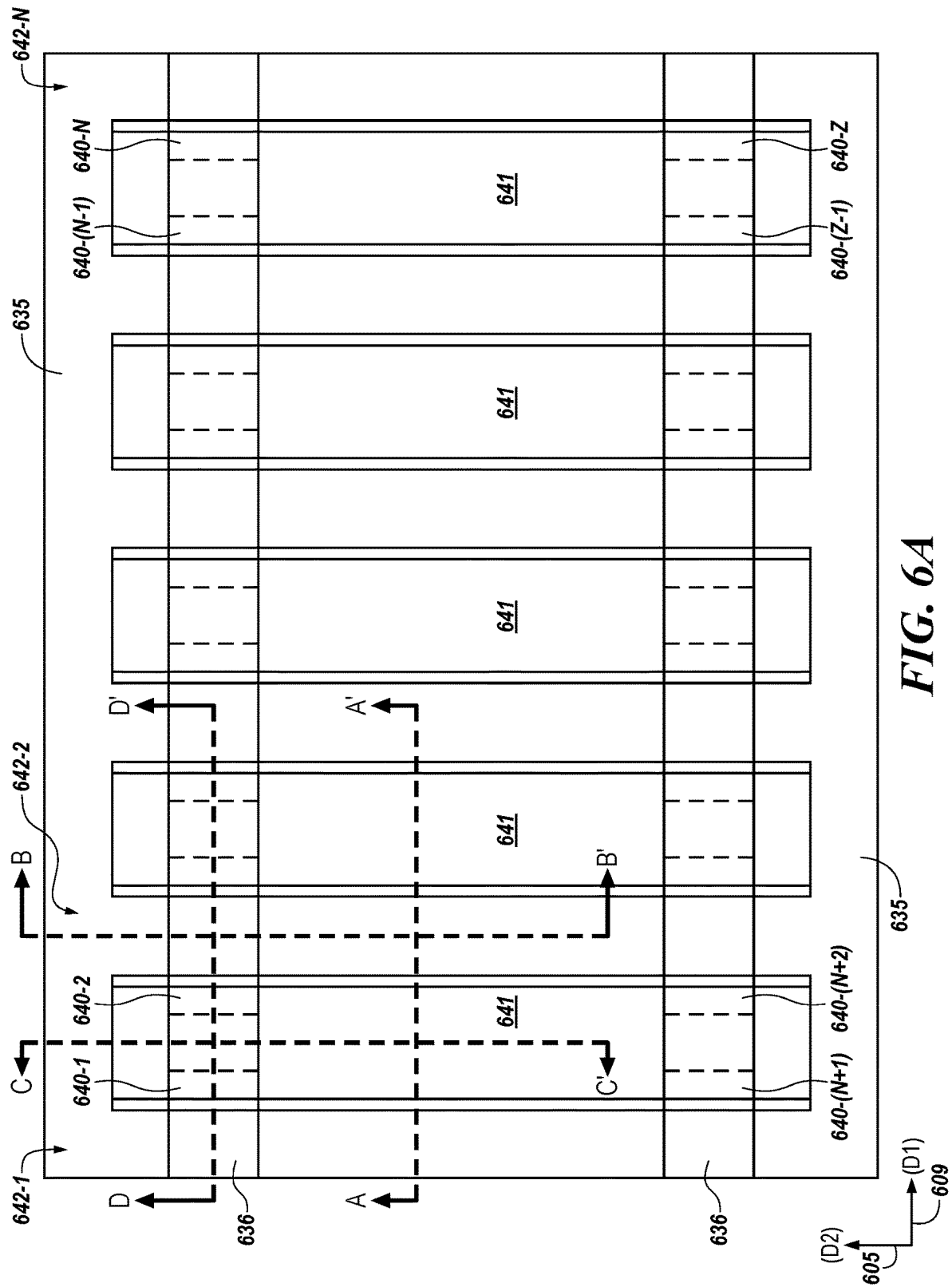

FIG. 6A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 6A illustrates a top down view of a semiconductor structure, at a particular point in time, in a semiconductor fabrication process, according to one or more embodiments. In the example embodiment of FIG. 6A, the method comprises using a photolithographic process to pattern the photolithographic mask 636, 536 in FIG. 5B. The method in FIG. 6A, further illustrates using a selective, isotropic etchant process remove portions of the exposed conductive material, 640-1, 640-2, . . . , 640-N, 640-(N+1), . . . , 640-(Z−1), and 640-Z, to separate and individually form the plurality of separate, vertical access lines, 640-1, 640-2, . . . , 640-N, 640-(N+1), . . . , 640-(Z−1), and 640-Z, e.g., access lines 103-1, 103-2, . . . , 103-Q in FIG. 1, et. seq. Hence the plurality of separate, vertical access lines, 640-1, 640-2, . . . , 640-N, 640-(N+1), . . . , 640-(Z−1), and 640-Z, are shown along the sidewalls of the elongated vertical, pillar columns, e.g., along sidewalls of the elongated vertical, pillar columns 542-1, 542-2, and 542-3 in the cross-sectional view of FIG. 5B.

As shown in the example of FIG. 6A, the exposed conductive material, 640-1, 640-2, . . . , 640-N, 640-(N+1), . . . , 640-(Z−1), and 640-Z, may be removed back to the gate dielectric material 638 in the first vertical openings, e.g., 500 in FIG. 5A, using a suitable selective, isotropic etch process. As shown in FIG. 6A, a subsequent dielectric material 641, such as an oxide or other suitable spin on dielectric (SOD), may then be deposited to fill the remaining openings from where the exposed conductive material, 640-1, 640-2, . . . , 640-N, 640-(N+1), . . . , 640-(Z−1), and 640-Z, was removed using a process such as CVD, or other suitable technique. The dielectric material 641 may be planarized to a top surface of the previous hard mask 635 of the vertical semiconductor stack, e.g., 401 as shown in FIG. 4, using a process such as CMP, or other suitable technique. In some embodiments, a subsequent photolithographic material 537, e.g., hard mask, may be deposited using CVD and planarized using CMP to cover and close the plurality of separate, vertical access lines, 640-1, 640-2, . . . , 640-N, 640-(N+1), . . . , 640-(Z−1), and 640-Z, over a working surface of the vertical semiconductor stack, 401 in FIG. 4, leaving the plurality of separate, vertical access lines, 640-1, 640-2, . . . , 640-N, 640-(N+1), . . . , 640-(Z−1), and 640-Z, protected along the sidewalls of the elongated vertical, pillar columns. Embodiments, however, are not limited to these process examples.

FIG. 6B illustrates a cross sectional view, taken along cut-line A-A' in FIG. 6A, showing another view of the semiconductor structure at this particular point in one example semiconductor fabrication process of an embodiment of the present disclosure. The cross sectional view shown in FIG. 6B is away from the plurality of separate, vertical access lines, 640-1, 640-2, . . . , 640-N, 640-(N+1), . . . , 640-(Z−1), and shows the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, on a semiconductor substrate 600 to form the vertical stack, e.g. 401 as shown in FIG. 4. As shown in FIG. 6B, a vertical direction 611 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 609. In the example embodiment of FIG. 6B, the dielectric material 641 is shown filling the vertical openings on the residual gate dielectric 638 deposition. The hard mask 637, described above, caps the illustrated structure.

FIG. 6C illustrates a cross sectional view, taken along cut-line B-B' in FIG. 6A, showing another view of the semiconductor structure at this particular point in one example semiconductor fabrication process of an embodiment of the present disclosure. The cross sectional view shown in FIG. 6C is illustrated extending in the second direction (D2) 605 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, along and in which the horizontally oriented access devices and horizontally oriented storage nodes, e.g., capacitor cells, can be formed within the layers of semiconductor material, 632-1, 632-2, . . . , 632-N. In FIG. 6C, a neighboring, opposing vertical access line 640-3 is illustrated by a dashed line indicating a location set in from the plane and orientation of the drawing sheet.

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second direction (D2) 605 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, outside of a region in which the horizontally oriented access devices and horizontally oriented storage nodes, e.g., capacitor cells, will be formed within the layers of semiconductor material, 632-1, 632-2, . . . , 632-N. In FIG. 6C, the dielectric material 641 is shown filling the space between the horizontally oriented access devices and horizontally oriented storage nodes, which can be spaced along a first direction (D1), extending into and out from the plane of the drawings sheet, for a three dimensional array of vertically oriented memory cells. At the left end of the drawing sheet is shown the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, at which location a horizontally oriented digit line, e.g., digit lines 107-1, 107-2, . . . , 107-P shown in FIG. 1, et. seq., can be integrated to form electrical contact with the second source/drain regions or digit line conductive contact material, described in more detail below.

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, intersecting across the plurality of separate, vertical access lines, 640-1, 640-2, . . . , 640-N, 640-(N+1), . . . , 640-(Z−1), and intersecting regions of the semiconductor material, 632-1, 632-2, . . . , 632-N, in which a channel region may be formed, separated from the plurality of separate, vertical access lines, 640-1, 640-2, . . . , 640-N, 640-(N+1), . . . , 640-(Z−1), by the gate dielectric 638. In FIG. 6E, the first dielectric fill material 639 is shown separating the space between neighboring horizontally oriented access devices and horizontally oriented storage nodes, which may be formed extending into and out from the plane of the drawing sheet as described in more detail below, and can be spaced along a first direction (D1) 609 and stacked vertically in arrays extending in the third direction (D3) 611 in the three dimensional (3D) memory.

Figure 7A:
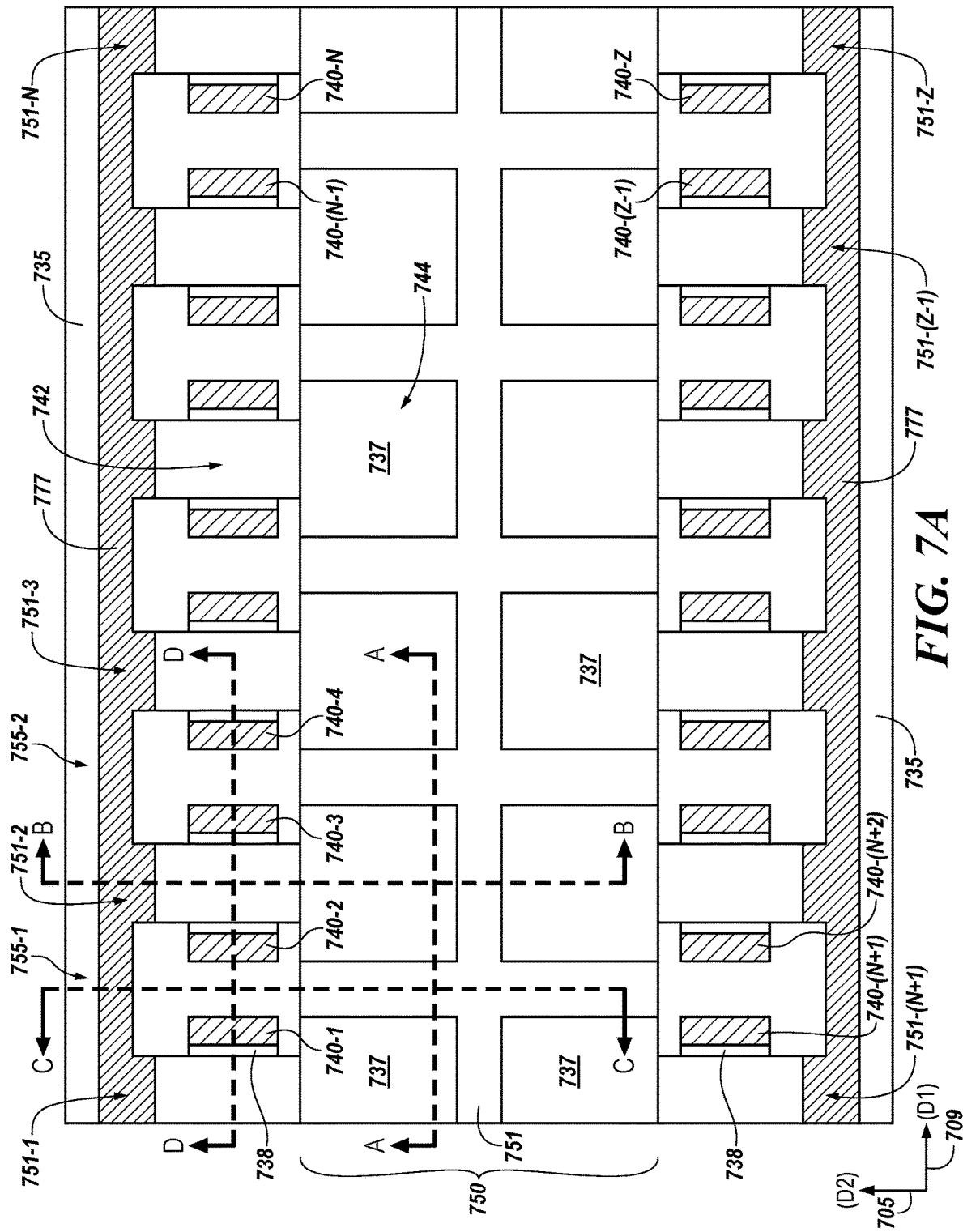

FIG. 7A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 7A illustrates a top down view of a semiconductor structure, at a particular point in time, in a semiconductor fabrication process, according to one or more embodiments. In the example embodiment of FIG. 7A, the method comprises using a photolithographic process to pattern the photolithographic masks 735, 736 and/or 737, e.g., 635, 636, and/or 637 in FIGS. 6A-6E. The method in FIG. 7A, further illustrates using one or more etchant processes to form a vertical opening 751 in a storage node region 750 (and 744 in FIGS. 7A and 7C) through the vertical stack and extending predominantly in the first horizontal direction (D1) 709. The one or more etchant processes forms a vertical opening 751 to expose third sidewalls in the repeating iterations of alternating layers of a first dielectric material, 730-1, 730-2, . . . , 730-N, a semiconductor material, 732-1, 732-2, . . . , 732-N, and a second dielectric material, 733-1, 733-2, . . . , 733-N, in the vertical stack, shown in FIGS. 7B-7E, adjacent a second region of the semiconductor material. Other numerated components may be analogous to those shown and discussed in connection with FIG. 6.

In some embodiments, this process is performed before the semiconductor fabrication process described in connection with FIGS. 4A-4K. However, the embodiment shown in FIGS. 7B-7E illustrate a sequence in which the storage node fabrication process is performed "after" the digit line 777 and first source/drain region formation, described in connection with FIGS. 4A-4K, have already been performed, e.g., digit line formation first. Here, the digit line 777 may be illustrated along the plurality of separate, vertical access lines 740.

According to an example embodiment, shown in FIGS. 7B-7E, the method comprises forming a second vertical opening 751 in the vertical stack (401 in FIG. 4A) and selectively etching the second region 744 of the semiconductor material, 732-1, 732-2, . . . , 732-N, to form a second horizontal opening 779 a second horizontal distance (D2 opening) back from the vertical opening 751 in the vertical stack (401 in FIG. 4A). According to embodiments, selectively etching the second region 744 of the semiconductor material, 732-1, 732-2, . . . , 732-N can comprise using an atomic layer etching (ALE) process. As will be explained more in connection with FIG. 7C, a second source/drain region 778 can be formed in the semiconductor material, 732-1, 732-2, . . . , 732-N at a distal end of the second horizontal openings 779 from the vertical opening.

FIG. 7B illustrates a cross sectional view, taken along cut-line A-A' in FIG. 7A, showing another view of the semiconductor structure at this particular point in one example semiconductor fabrication process of an embodiment of the present disclosure. The cross sectional view shown in FIG. 7B is away from the plurality of separate, vertical access lines, 740-1, 740-2, . . . , 740-N, 740-(N+1), . . . , 740-(Z−1), and shows repeating iterations of alternating layers of a dielectric material, 730-1, 730-2, . . . , 730-(N+1), a semiconductor material, 732-1, 732-2, . . . , 732-N, and a second dielectric material, 733-1, 733-2, . . . , 733-N separated by an opening 751, on a semiconductor substrate 700 to form the vertical stack. As shown in FIG. 7B, a vertical direction 711 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 709. In the example embodiment of FIG. 7B, the materials within the vertical stack—a dielectric material, 730-1, 730-2, . . . , 730-(N+1), a semiconductor material, 732-1, 732-2, . . . , 732-N, and a second dielectric material, 733-1, 733-2, . . . , 733-N are extending into and out of the plane of the drawing sheet in second direction (D2) and along an axis of orientation of the horizontal access devices and horizontal storage nodes of the arrays of vertically stacked memory cells of the three dimensional (3D) memory.

FIG. 7C illustrates a cross sectional view, taken along cut-line B-B' in FIG. 7A, showing another view of the semiconductor structure at this particular point in one example semiconductor fabrication process of an embodiment of the present disclosure. The cross sectional view shown in FIG. 7C is illustrated extending in the second direction (D2) 705, left and right along the plane of the drawing sheet, along an axis of the repeating iterations of alternating layers of a first dielectric material, 730-1, 730-2, . . . , 730-N, a semiconductor material, 732-1, 732-2, . . . , 732-N, and a second dielectric material, 733-1, 733-2, . . . , 733-N, along and in which the horizontally oriented access devices and horizontally oriented storage nodes, e.g., capacitor cells, can be formed within the layers of semiconductor material, 732-1, 732-2, . . . , 732-N.

In the example embodiment of FIG. 7C, a vertical opening 751 and horizontal openings 779 are shown formed from the mask, patterning and etching process described in connection with FIG. 7A. As shown in FIG. 7C, the semiconductor material, 732-1, 732-2, . . . , 732-N, in the second region 744 has been selectively removed to form the horizontal openings 779. In one example, an atomic layer etching (ALE) process is used to selectively etch the semiconductor material, 732-1, 732-2, . . . , 732-N, and remove a second distance (D2 opening) back from the vertical opening 751. Horizontally oriented storage nodes, e.g., capacitor cells, may be formed, as shown in FIGS. 8A-8E, later or first, relative to the fabrication process shown in FIGS. 4A-4K, in the second horizontal openings 779.

Also shown in FIG. 7C, the first source/drain region 775 may be formed by gas phase doping a dopant into a top surface portion of the semiconductor material 732. In some embodiments, the first source/drain region 775 may be adjacent to vertical access line 740. According to one example embodiment, as shown in FIG. 7C a second source/drain region 778 may be formed by flowing a high energy gas phase dopant, such as Phosphorous (P) for an n-type transistor, into the second horizontal openings 779 to dope the dopant in the semiconductor material, 732-1, 732-2, . . . , 732-N, at a distal end of the second horizontal openings 779 from the vertical opening 751. In one example, gas phase doping may be used to achieve a highly isotropic e.g., non-directional doping, to form the second source/drain region 778 to a horizontally oriented access device in region 742. In another example, thermal annealing with doping gas, such as phosphorous may be used with a high energy plasma assist to break the bonding. Embodiments, however, are not so limited and other suitable semiconductor fabrication techniques may be utilized.

Conductive material 777 may be deposited adjacent second dielectric material 733. The conductive material 777 may remain in direct electrical contact on a top surface of the first source/drain region 775. As such, the conductive material 777 remains in electrical contact with the source/drain region 775. In some embodiments, the third dielectric material 774 may be below the first dielectric material 730 while remaining in direct contact with the conductive material 777, the first source/drain region 775, and the first portion of the low doped semiconductor material 732. The third dielectric material 774 may form a direct, electrical contact with a high doped, p-type (p+) silicon material 795, e.g., the body region contact of the horizontally oriented access device.

As shown further in FIG. 7C, a first electrode, e.g., 761, for horizontally oriented storage nodes are to be coupled to the second source/drain regions 778 of the horizontal access devices. As shown later in FIG. 7C, such horizontally oriented storage nodes are shown formed in a second horizontal opening 779 extending in second direction (D2), left and right in the plane of the drawing sheet, a second distance (D2 opening) from the vertical opening 751 formed in the vertical stack, e.g., 401 in FIG. 4A, and along an axis of orientation of the horizontal access devices and horizontal storage nodes of the arrays of vertically stacked memory cells of the three dimensional (3D) memory. In FIG. 7C, a neighboring, opposing vertical access line 740-3 is illustrated by a dashed line indicating a location set inward from the plane and orientation of the drawing sheet.

FIG. 7D illustrates a cross sectional view, taken along cut-line C-C' in FIG. 7A, showing another view of the semiconductor structure at this particular point in one example semiconductor fabrication process of an embodiment of the present disclosure. The cross sectional view shown in FIG. 7D is illustrated extending in the second direction (D2) 705, left and right in the plane of the drawing sheet, along an axis of the repeating iterations of alternating layers of a first dielectric material, 730-1, 730-2, ..., 730-N, a semiconductor material, 732-1, 732-2, ..., 732-N, and a second dielectric material, 733-1, 733-2, ..., 733-N, outside of a region in which the horizontally oriented access devices and horizontally oriented storage nodes, e.g., capacitor cells, will be formed within the layers of semiconductor material, 732-1, 732-2, ..., 732-N. At the left end of the drawing sheet is shown the repeating iterations of alternating layers of a first dielectric material, 730-1, 730-2, ..., 730-N, a semiconductor material, 732-1, 732-2, ..., 732-N, and a second dielectric material, 733-1, 733-2, ..., 733-N, at which location a horizontally oriented digit line, e.g., digit lines 107-1, 107-2, ..., 107-P shown in FIG. 1, et. seq., can be integrated to form electrical contact with first source/drain regions or digit line conductive contact material, described above in connection with FIGS. 4A-4K.

Again, while first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

In some embodiments, a conductive material 777 may be illustrated adjacent second dielectric material 733. The conductive material 777 may be adjacent dielectric material 741. A body contact region 795 may be illustrated along the repeating iterations of alternating layers of a first dielectric material, 730-1, 730-2, ..., 730-N, a semiconductor material, 732-1, 732-2, ..., 732-N, and a second dielectric material, 733-1, 733-2, ..., 733-N.

FIG. 7E illustrates a cross sectional view, taken along cut-line D-D' in FIG. 7A, showing another view of the semiconductor structure at this particular point in one example semiconductor fabrication process of an embodiment of the present disclosure. The cross sectional view shown in FIG. 7E is illustrated, right to left in the plane of the drawing sheet, extending in the first direction (D1) 709 along an axis of the repeating iterations of alternating layers of a first dielectric material, 730-1, 730-2, ..., 730-N, a semiconductor material, 732-1, 732-2, ..., 732-N, and a second dielectric material, 733-1, 733-2, ..., 733-N, intersecting across the plurality of separate, vertical access lines, 740-1, 740-2, ..., 740-4, and intersecting regions of the semiconductor material, 732-1, 732-2, ..., 732-N, in which a channel region may be formed, separated from the plurality of separate, vertical access lines, 740-1, 740-2, ..., 740-4, by the gate dielectric 738. In FIG. 7E, the first dielectric fill material 739 is shown separating the space between neighboring horizontally oriented access devices which may be formed extending into and out from the plane of the drawing sheet as described in connection with FIGS. 4A-4K, and can be spaced along a first direction (D1) 709 and stacked vertically in arrays extending in the third direction (D3) 711 in the three dimensional (3D) memory.

Figure 8A:
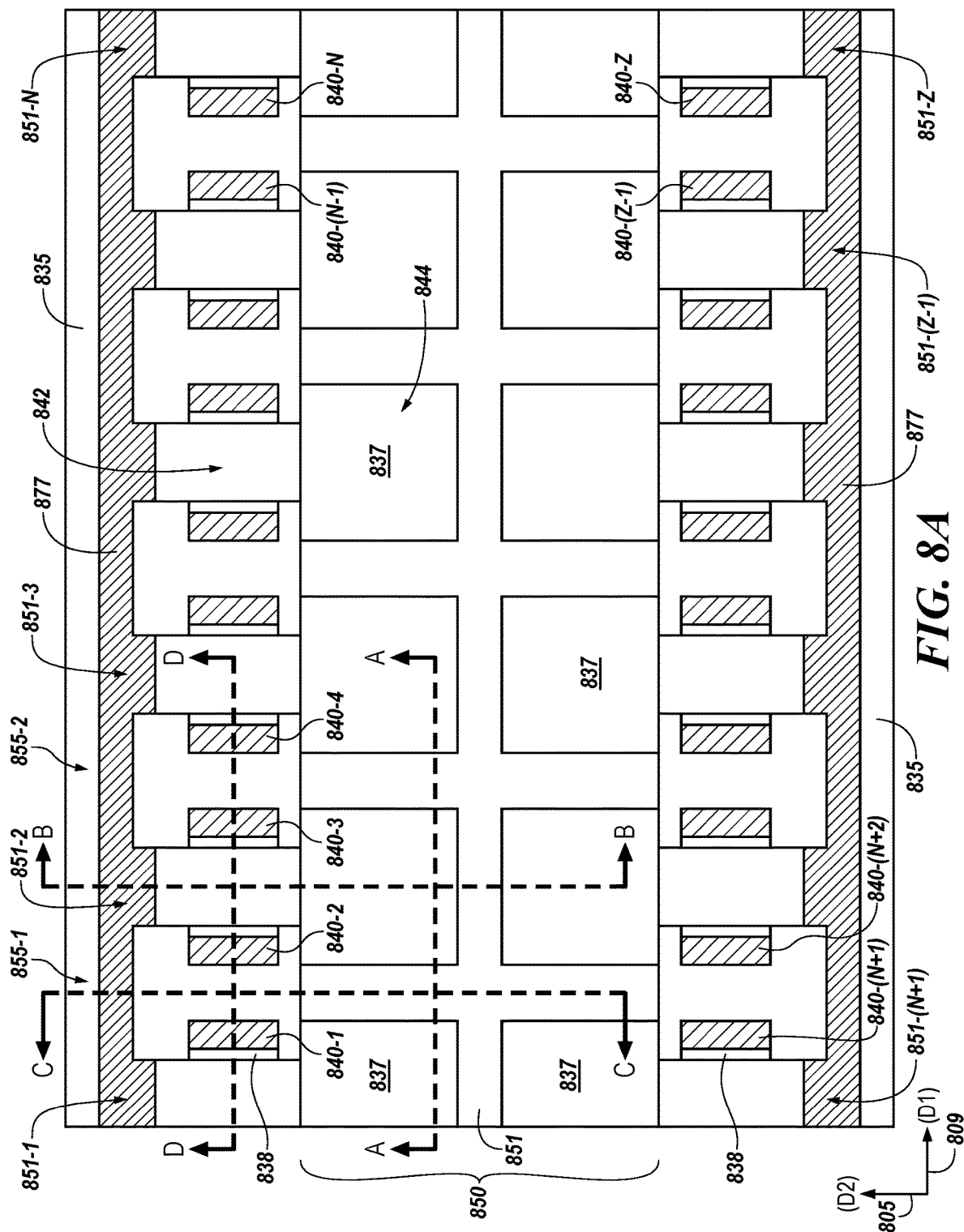

FIG. 8A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments. In the example embodiment of FIG. 8A, the method comprises using a photolithographic process to pattern the photolithographic masks 835, 836 and/or 837, e.g., 635, 636, and/or 637 in FIGS. 6A-6E or 735, 736, and/or 737 in FIGS. 7A-7E. The method in FIG. 8A, further illustrates using one or more etchant processes to form a vertical opening 851 in a storage node region 850 (and 844 in FIGS. 8A and 8C) through the vertical stack and extending predominantly in the first horizontal direction (D1) 809. The one or more etchant processes forms a vertical opening 851 to expose third sidewalls in the repeating iterations of alternating layers of a first dielectric material, 830-1, 830-2, ..., 830-N, a semiconductor material, 832-1, 832-2, ..., 832-N, and a second dielectric material, 833-1, 833-2, ..., 833-N, in the vertical stack, shown in FIGS. 8B-8E, adjacent a second region of the semiconductor material. Other numerated components may be analogous to those shown and discussed in connection with FIGS. 6 and 7.

In some embodiments, this process is performed after selectively removing an access device region of the semiconductor material in which to form a first source/drain region, channel region, and second source/drain region of the horizontally oriented access devices, as illustrated in FIG. 7. According to an example embodiment, shown in FIGS. 8B-8E, the method comprises selectively etching the second region of the semiconductor material, 832-1, 832-2, ..., 832-N, to deposit a second source/drain region and capacitor cells through the second horizontal opening, which is a second horizontal distance back from a vertical opening 851 in the vertical stack. In some embodiments, as shown in FIGS. 8B-8E, the method comprises forming capacitor cell as the storage node in the second horizontal opening. By way of example, and not by way of limitation, forming the capacitor comprises using an atomic layer deposition (ALD) process to sequentially deposit, in the second horizontal opening, a first electrode 861 and a second electrode 856 separated by a cell dielectric 863. Other suitable semiconductor fabrication techniques and/or storage nodes structures may be used. A digit line 877 may be seen along the plurality of separate, vertical access lines 840.

FIG. 8B illustrates a cross sectional view, taken along cut-line A-A' in FIG. 8A, showing another view of the semiconductor structure at this particular point in one example semiconductor fabrication process of an embodiment of the present disclosure. The cross sectional view shown in FIG. 8B is away from the plurality of separate, vertical access lines, 840-1, 840-2, ..., 840-N, 840-(N+1), ..., 840-(Z−1), and shows repeating iterations of alternating layers of a dielectric material, 830-1, 830-2, ..., 830-(N+1), separated by horizontally oriented capacitor cells having first electrodes 861, e.g., bottom cell contact electrodes, cell dielectrics 863, and second electrodes 856, e.g., top, common node electrodes, on a semiconductor substrate 800 to form the vertical stack. As shown in FIG. 8B, a vertical direction 811 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 809. In the example embodiment of FIG. 8B, the first electrodes 861, e.g., bottom electrodes to be coupled to source/drain regions of horizontal access devices, and second electrodes 856 are illustrated separated by a cell dielectric material 863 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 8C illustrates a cross sectional view, taken along cut-line B-B' in FIG. 8A, showing another view of the semiconductor structure at this particular point in one example semiconductor fabrication process of an embodiment of the present disclosure. The cross sectional view shown in FIG. 8C is illustrated extending in the second direction (D2) 805, left and right along the plane of the drawing sheet, along an axis of the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N, along and in which the horizontally oriented access devices and horizontally oriented storage nodes, e.g., capacitor cells, can be formed within the layers of semiconductor material, 832-1, 832-2, . . . , 832-N. In the example embodiment of FIG. 8C, the horizontally oriented storage nodes, e.g., capacitor cells, are illustrated as having been formed been formed in this semiconductor fabrication process and first electrodes 861, e.g., bottom electrodes to be coupled to source/drain regions of horizontal access devices, and second electrodes 856, e.g., top electrodes to be coupled to a common electrode plane such as a ground plane, separated by cell dielectrics 863, are shown. However, embodiments are not limited to this example. In other embodiments the first electrodes 861, e.g., bottom electrodes to be coupled to source/drain regions of horizontal access devices, and second electrodes 856, e.g., top electrodes to be coupled to a common electrode plane such as a ground plane, separated by cell dielectrics 863, may be formed subsequent to forming a first source/drain region, a channel region, and a second source/drain region in a region of the semiconductor material, 832-1, 832-2, . . . , 832-N, intended for location, e.g., placement formation, of the horizontally oriented access devices, described next.

In the example embodiment of FIG. 8C, the horizontally oriented storage nodes having the first electrodes 861, e.g., bottom electrodes to be coupled to source/drain regions of horizontal access devices, and second electrodes 856, e.g., top electrodes to be coupled to a common electrode plane such as a ground plane, are shown formed in a second horizontal opening, e.g., 779 shown in FIG. 7C, extending in second direction (D2), left and right in the plane of the drawing sheet, a second distance (D2 opening) from the vertical opening, e.g., 751 in FIG. 7C, formed in the vertical stack, e.g., 401 in FIG. 4A, and along an axis of orientation of the horizontal access devices and horizontal storage nodes of the arrays of vertically stacked memory cells of the three dimensional (3D) memory. In FIG. 8C, a neighboring, opposing vertical access line 840-3 is illustrated by a dashed line indicating a location set inward from the plane and orientation of the drawing sheet.

Conductive material 877 may be illustrated adjacent second dielectric material 833. The conductive material 877 may remain in direct electrical contact on a top surface of the first source/drain region 875. As such, the conductive material 877 remains in electrical contact with the source/drain region 875. In some embodiments, the third dielectric material 874 may be below the first dielectric material 830 while remaining in direct contact with the conductive material 877, the first source/drain region 875, and the first portion of the low doped semiconductor material 832. The third dielectric material 874 may form a direct, electrical contact with a high doped, p-type (p+) silicon material 895, e.g., the body region contact of the horizontally oriented access device.

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second direction (D2) 805, left and right in the plane of the drawing sheet, along an axis of the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N, outside of a region in which the horizontally oriented access devices and horizontally oriented storage nodes, e.g., capacitor cells, will be formed within the layers of semiconductor material, 832-1, 832-2, . . . , 832-N. In FIG. 8C, the dielectric material 841 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 8D, the second electrode 856, e.g., top, common electrode to a capacitor cell structure, is additionally shown present in the space between horizontally neighboring devices. At the left end of the drawing sheet is shown the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N, at which location a horizontally oriented digit line, e.g., digit lines 107-1, 107-2, . . . , 107-P shown in FIG. 1, et. seq., can be integrated to form electrical contact with the second source/drain regions or digit line conductive contact material, described in more detail below.

In some embodiments, a conductive material 877 may be illustrated adjacent second dielectric material 833. The conductive material 877 may be adjacent dielectric material 841. A body contact region 895 may also be illustrated along the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N.

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a first dielectric material, 830-1, 830-2, . . . , 830-N, a semiconductor material, 832-1, 832-2, . . . , 832-N, and a second dielectric material, 833-1, 833-2, . . . , 833-N, intersecting across the plurality of separate, vertical access lines, 840-1, 840-2, . . . , 840-4, and intersecting regions of the semiconductor material, 832-1, 832-2, . . . , 832-N, in which a channel region may be formed, separated from the plurality of separate, vertical access lines, 840-1, 840-2, . . . , 840-4, by the gate dielectric 838. In FIG. 8E, the first dielectric fill material 839 is shown separating the space between neighboring horizontally oriented access devices and horizontally oriented storage nodes, which may be formed extending into and out from the plane of the drawing sheet as described in more detail below, and can be spaced along a first direction (D1) 809 and stacked vertically in arrays extending in the third direction (D3) 811 in the three dimensional (3D) memory.

FIG. 9 illustrates a cross-sectional view of a portion of an example horizontally oriented access device coupled to a horizontally oriented storage node and coupled to vertically oriented access lines and horizontally oriented digit lines, as may form part of an array of vertically stacked memory cells, in accordance with a number of embodiments of the present disclosure. The horizontally oriented access device 901 can have a first source/drain region and a second source drain region separated by a channel region, and gates opposing the channel region and separated therefrom by a gate dielectric.

As shown in the example of FIG. 9, a first source/drain region 975-1 is illustrated in direct, electrical contact with a horizontally oriented digit line 977-1. In some embodiments, the conductive digit lines 977-1 and 977-2 are formed of metal composition comprising tungsten (W). However, embodiments are not limited to this example. While the terms "first" and "second" source/drain regions may be used herein to designate distinct and separate source/drain regions, the terms "first" and/or "second" are not limited to a respective one of the source/drain regions, and their respective placement and their respective "first" or "second" labels, used herein for convenience, may be interchanged within the horizontally oriented access devices described herein. For example, the first source/drain region 975-1 may equally be referenced as a "second" source/drain region 975-1. Whether labeled "first" or "second" the source/drain region may be separated by a channel region in a body of the horizontal access device from another source/drain region.

In the example of FIG. 9, the first source/drain region 975-1 is illustrated formed in a body of a low doped, p-type (p−) channel and body region of the horizontally oriented access device 901. The first source/drain region 975-1 is separated from a vertical body contact 995 by a dielectric material 974. As shown, interlayer dielectric (ILD) materials 930-1 and 930-2 may separate the horizontally oriented access devices of the vertically stacked memory cells. The interlayer dielectric materials 930-1 and 930-2 may be a first dielectric material type, e.g., an oxide based dielectric material. However, embodiments are not limited to this example.

In the example of FIG. 9, the horizontally oriented digit lines, e.g., 977-1 and 977-2, are formed in a second dielectric material type, e.g., a nitride based dielectric material. However, embodiments are not limited to this example. According to embodiments, the first dielectric type material and the second dielectric type material are different compositions and distinct such that one, e.g., the second dielectric, nitride material may be selectively etched relative to the first dielectric material, e.g., oxide material. The first dielectric materials, 930-1 and 930-2, the horizontally oriented access device 901 comprising the first source/drain region 975-1 and p-type channel in a body region 932-1, and the digit lines 977-1 and 977-2 form a three layer tier to the vertically stacked memory cells.

As shown in the example embodiment of FIG. 9, a vertical body contact 995 is formed in direct, electrical contact with a body region 932-1 of one or more of the horizontally oriented access devices 901. In some embodiments, the vertical body contact 995 may be a metal such as tungsten (W). In some embodiments, the vertical body contact 995 may be a conductively doped polysilicon material such as a high doped, p-type (p+) polysilicon semiconductor material. Embodiments, however, are not limited to these examples. As used herein, the terms "high doping" is intended to mean a high concentration of a dopant impurity such that there is significant interaction between the dopant atoms. A p-type dopant may include boron atoms (B) and an n-type dopant may include phosphorus atoms (P). According to embodiments, the vertical body contact 995 is separated from the first source/drain region 975-1 and the horizontally oriented digit lines 977-1 and 977-2 by a dielectric 974, e.g., in this example SiN.

In some embodiments, the dielectric 974 further separates a first portion, e.g., 478 in FIG. 4H, of the body region 932-1 of the horizontally oriented access devices 901 from the vertical body contact 995 to reduce hole formation in the body region 932-1 between the vertical body contact 995 and the body region 932-1. In some embodiments the dielectric 974 further separates a first portion, e.g., 478 in FIG. 4H, of the body region 932-1 of the horizontally oriented access devices 901 from the vertical body contact 995 to reduce gate induced drain leakage (GIDL) in the horizontally oriented access devices 901. In some embodiments horizontally oriented storage nodes, e.g., capacitor cells as shown in FIG. 7C, are coupled to a second source/drain region (not shown in FIG. 9). In such an example the capacitor cells have a first horizontally oriented electrode electrically coupled to the second source/drain regions and a second horizontally oriented electrode separated from the first horizontally oriented electrode by a cell dielectric.

Thus, as shown in the example embodiment of FIG. 9, a vertical, conductive body contact line 995 such as a high doped semiconductor material may be deposited into a vertical opening 995 to form a conductive body contact directly to and only with a portion of the a low doped semiconductor material channel and body region 932-1 of the horizontally oriented access devices.

According to embodiments, depositing the second dielectric material 974 forms a smaller area of direct electrical contact between the conductive body contact 995 and the channel in a body region 932-1 of the horizontally oriented access device while also electrically isolating, from direct electric, the first source/drain region 975-1 and the digit lines 977-1 and 977-2. The smaller area of direct electrical contact between the conductive body contact 995 and the channel in a body region 932-1 and the electrical isolation from the first source/drain region 975-1 and digit lines 977-1 and 977-2 may reduce capacitive coupling between the body contact 995 and the first source/drain region 975-1 and digit lines 977-1 and 977-2. The smaller area of direct electrical contact may also block diffusion of holes between the high doped semiconductor material 995 and the body region 932-1.

Figure 10:
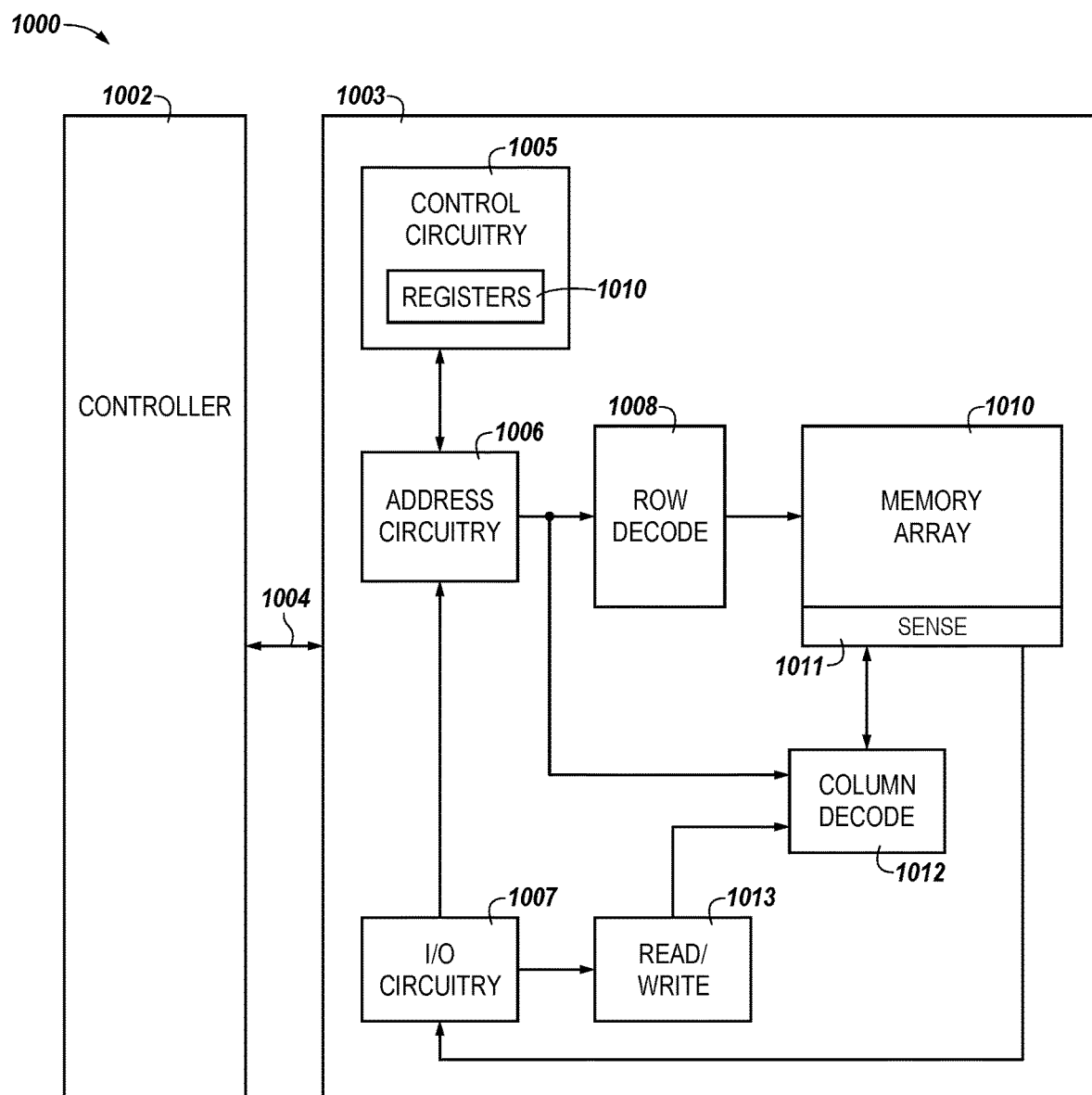
FIG. 10 is a block diagram of an apparatus in the form of a computing system including a memory device in accordance with a number of embodiments of the present disclosure.

FIG. 10 is a block diagram of an apparatus in the form of a computing system 1000 including a memory device 1003 in accordance with a number of embodiments of the present disclosure. As used herein, a memory device 1003, a memory array 1010, and/or a host 1002, for example, might also be separately considered an "apparatus." According to embodiments, the memory device 1002 may comprise at least one memory array 1010 with a memory cell formed having a digit line and body contact, according to the embodiments described herein.

In this example, system 1000 includes a host 1002 coupled to memory device 1003 via an interface 1004. The computing system 1000 can be a personal laptop computer, a desktop computer, a digital camera, a mobile telephone, a memory card reader, or an Internet-of-Things (IoT) enabled device, among various other types of systems. Host 1002 can include a number of processing resources (e.g., one or more processors, microprocessors, or some other type of controlling circuitry) capable of accessing memory 1003. The system 1000 can include separate integrated circuits, or both the host 1002 and the memory device 1003 can be on the same integrated circuit. For example, the host 1002 may be a system controller of a memory system comprising multiple memory devices 1003, with the system controller 1005 providing access to the respective memory devices 1003 by another processing resource such as a central processing unit (CPU).

In the example shown in FIG. 10, the host 1002 is responsible for executing an operating system (OS) and/or various applications (e.g., processes) that can be loaded thereto (e.g., from memory device 1003 via controller 1005). The OS and/or various applications can be loaded from the memory device 1003 by providing access commands from the host 1002 to the memory device 1003 to access the data comprising the OS and/or the various applications. The host 1002 can also access data utilized by the OS and/or various applications by providing access commands to the memory device 1003 to retrieve said data utilized in the execution of the OS and/or the various applications.

For clarity, the system 1000 has been simplified to focus on features with particular relevance to the present disclosure. The memory array 1010 can be a DRAM array comprising at least one memory cell having a digit line and body contact formed according to the techniques described herein. For example, the memory array 1010 can be an unshielded DL 4F2 array such as a 3D-DRAM memory array. The array 1010 can comprise memory cells arranged in rows coupled by word lines (which may be referred to herein as access lines or select lines) and columns coupled by digit lines (which may be referred to herein as sense lines or data lines). Although a single array 1010 is shown in FIG. 10, embodiments are not so limited. For instance, memory device 1003 may include a number of arrays 1010 (e.g., a number of banks of DRAM cells).

The memory device 1003 includes address circuitry 1006 to latch address signals provided over an interface 1004. The interface can include, for example, a physical interface employing a suitable protocol (e.g., a data bus, an address bus, and a command bus, or a combined data/address/command bus). Such protocol may be custom or proprietary, or the interface 1004 may employ a standardized protocol, such as Peripheral Component Interconnect Express (PCIe), Gen-Z, CCIX, or the like. Address signals are received and decoded by a row decoder 1008 and a column decoder 1012 to access the memory array 1010. Data can be read from memory array 1010 by sensing voltage and/or current changes on the sense lines using sensing circuitry 1011. The sensing circuitry 1011 can comprise, for example, sense amplifiers that can read and latch a page (e.g., row) of data from the memory array 1010. The I/O circuitry 1007 can be used for bi-directional data communication with the host 1002 over the interface 1004. The read/write circuitry 1013 is used to write data to the memory array 1010 or read data from the memory array 1010. As an example, the circuitry 1013 can comprise various drivers, latch circuitry, etc.

Control circuitry 1005 decodes signals provided by the host 1002. The signals can be commands provided by the host 1002. These signals can include chip enable signals, write enable signals, and address latch signals that are used to control operations performed on the memory array 1010, including data read operations, data write operations, and data erase operations. In various embodiments, the control circuitry 1005 is responsible for executing instructions from the host 1002. The control circuitry 1005 can comprise a state machine, a sequencer, and/or some other type of control circuitry, which may be implemented in the form of hardware, firmware, or software, or any combination of the three. In some examples, the host 1002 can be a controller external to the memory device 103. For example, the host 1002 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and vertically oriented access lines, comprising:
    depositing layers of a first dielectric material, a semiconductor material, and a second dielectric material, in repeating iterations vertically to form a vertical stack, wherein the semiconductor material includes a low doped semiconductor material within which to form a first and a second source/drain region separated laterally by a channel region;
    forming a vertical opening using a first etchant process to expose vertical sidewalls in the vertical stack;
    selectively etching the second dielectric material to form a first horizontal opening by removing the second dielectric material a first distance back from the vertical opening;
    gas phase doping a dopant in a top surface of the low doped semiconductor material to form the first source/drain region;
    depositing a conductive material onto the top surface above the first source/drain region in the first horizontal opening;
    selectively etching the conductive material, first source/drain region and a first portion of the low doped semiconductor material beneath the first source/drain region to form a second horizontal opening having a second distance horizontally back from the vertical opening;
    depositing a third dielectric material in second horizontal opening laterally adjacent the conductive material and the first source/drain region; and
    depositing a high doped semiconductor material into the vertical opening to form a conductive body contact to the second portion of the low doped semiconductor material.

2. The method of claim 1, wherein depositing the layers of the first dielectric material, the semiconductor material, and the second dielectric material, in repeating iterations vertically to form the vertical stack, comprises:
    depositing an oxide material as the first dielectric material;
    depositing low doped, p-type (p−) polysilicon as the semiconductor material; and
    depositing a silicon nitride (SiN) material as the second dielectric material.

3. The method of claim 2, further comprising selectively etching the second dielectric layer using a second etchant process to form the first horizontal opening to a first height laterally recessed the first distance back from the vertical opening.

4. The method of claim 1, further comprising gas phase doping in the top surface a high concentration, n-type dopant (n+) to form the first source/drain region, wherein the semiconductor material is a low doped, p-type (p−) semiconductor material.

5. The method of claim 1, wherein depositing the conductive material comprises depositing a titanium/titanium nitride (TiN) conductive material, via the vertical opening, to form a titanium silicide as part of the horizontally oriented digit line to each of the horizontally oriented access devices.

6. The method of claim 1, wherein depositing the conductive material comprises depositing a metal containing material, via the vertical opening, to form a horizontally oriented digit line to each of the horizontally oriented access devices.

7. The method of claim 6, further comprising depositing a tungsten (W) composition as the metal containing material.

8. The method of claim 6, further comprising depositing a ruthenium (Ru) composition as the metal containing material.

9. The method of claim 6, further comprising:
    selectively etching the metal containing material the second distance horizontally back from the vertical opening to remain above and in electrical contact with the first source/drain region; and
    selectively etching the metal containing material using a third etchant process before selectively etching the first source/drain region and the first portion of the low doped semiconductor material beneath the first source/drain region using a fourth etchant process to form the second horizontal opening, the second horizontal opening having a second height.

10. The method of claim 6, further comprising selectively etching the metal containing material using an atomic layer etching (ALE) etchant process.

11. The method of claim 1, further comprising depositing a silicon nitride (SiN) material as the third dielectric material.

12. The method of claim 1, further comprising etching the stack using a fifth etchant process to:
    maintain the vertical opening; and
    expose sidewalls of the third dielectric material a second portion of the low doped semiconductor material and the second dielectric material.

13. The method of claim 1, further comprising:
    depositing a high concentration, p-type dopant (p+) polysilicon material into the first vertical opening to form the conductive body contact to a second portion of a low concentration, p-type dopant (p−) body region;
    the high concentration, p+ body contact to reduce holes generated by gate-induced drain leakage (GIDL) in operation of the laterally oriented access devices.

14. A method for forming memory arrays having vertically stacked memory cells and having horizontally oriented access devices with vertically oriented access lines, comprising:

depositing layers of an oxide material, a semiconductor material, and a first nitride material, in repeating iterations vertically to form a vertical stack, wherein the semiconductor material includes a low doped semiconductor material to form a first and a second source/drain region separated laterally by a channel region;

forming a vertical opening using a first etchant process to expose vertical sidewalls in the vertical stack;

selectively etching the first nitride material, to form a first horizontal opening having a first height (H1) and to recess the first nitride material a first distance (D1) from a vertical opening formed through the repeating layers;

gas phase doping a dopant in a top surface of the low doped semiconductor material to form the first source/drain region;

depositing a conductive material onto a top surface of the low doped semiconductor material above the first source/drain region below the laterally recessed first nitride material;

selectively etching the conductive material, first source/drain region and a first portion of the low doped semiconductor material beneath the first source/drain region via the vertical opening leaving a portion of the conductive material above the first source/drain region to form a second horizontal opening having a second distance from the vertical opening;

depositing a second nitride material in the second horizontal opening having a second height (H2) and laterally adjacent the conductive material and the first source/drain region; and etching the stack vertically to maintain the vertical opening and to expose sidewalls to second nitride material, a second portion of the low doped semiconductor material, and the oxide material to form a body contact area to prevent source/drain leakage and hole formation in the horizontally oriented access devices.

15. The method of claim 14, wherein forming the first source/drain region comprises depositing a high concentration, n-type dopant (n+) phosphorous (P) material into the top surface of a low doped, p-type (p−) semiconductor material.

16. The method of claim 14, further comprising using an atomic layer etching (ALE) process to selectively etch the first nitride material.

17. The method of claim 14, further comprising depositing a high doped, p-type (p+) polysilicon semiconductor material into the vertical opening to form a direct, electrical body contact only to a second portion of the low doped, p-type (p−) semiconductor material.

18. The method of claim 17, further comprising forming the second horizontal opening having the second height (H2) greater in comparison to the first height (H1) of the second nitride material.

19. The method of claim 18, further comprising depositing the second nitride material to block diffusion between a high doped, p-type (p+) semiconductor material and the first source/drain region.

20. The method of claim 17, further comprising depositing a high doped, p-type (p+) polysilicon semiconductor material to control a channel potential within the high doped, p-type (p+) polysilicon semiconductor material and to control hole formation within the low doped, p-type (p−) semiconductor material of the horizontally oriented access devices.

21. The method of claim 14, further comprising depositing a conductive material into the vertical opening to form a conductive body contact only to the second portion of the low doped semiconductor material.

22. The method of claim 21, wherein depositing the conductive material comprises depositing a high doped (p+) poly-silicon germanium (SiGe) material.

23. The method of claim 21, further comprising depositing a composite material of a high doped (p+) poly-silicon (Si) layer in electrical contact with the low doped (p−) semiconductor material, a titanium/titanium nitride (Ti/TiN) layer on the high doped (p+) polysilicon to form a titanium silicide, and a tungsten (W) material to form the conductive body contact.

24. The method of claim 14, further comprising depositing a second silicon nitride (SiN) material in the second horizontal opening to reduce capacitive coupling between a high doped, p-type (p+) polysilicon semiconductor material and the first source/drain region of the horizontally oriented access devices.

25. The method of claim 14, further comprising depositing a second silicon nitride (SiN) material in the second horizontal opening to reduce hole formation in a body region of the horizontally oriented access devices between a high concentration, p-type doped (p+) polysilicon semiconductor material forming the body contact and the first source/drain region.

26. A memory device, comprising:
an array of vertically stacked memory cells, the array of vertically stacked memory cells, comprising:
horizontally oriented access devices having a first source/drain region and a second source drain region separated by a channel region, and gates opposing the channel region and separated therefrom by a gate dielectric;
vertically oriented access lines coupled to the gates and separated from the channel region by the gate dielectric;
horizontally oriented storage nodes electrically coupled to the second source/drain regions of the horizontally oriented access devices;
horizontally oriented digit lines electrically coupled to the first source/drain regions of the horizontally oriented access devices; and
a vertical body contact formed in direct, electrical contact with a body region of one or more of the horizontally oriented access devices and separated from the first source/drain region and the horizontally oriented digit lines by a dielectric.

27. The memory device of claim 26, wherein the gate dielectric further separates a first portion of the body region of the horizontally oriented access devices from the vertical body contact to reduce hole formation in the body region between the vertical body contact and the body region.

28. The memory device of claim 26, dielectric further separates a first portion of the body region of the horizontally oriented access devices from the vertical body contact to reduce gate induced drain leakage (GIDL) in the horizontally oriented access devices.

29. The memory device of claim 26, wherein the horizontally oriented storage nodes comprise capacitor cells having a first horizontally oriented electrode electrically coupled to the second source/drain regions and a second horizontally oriented electrode separated from the first horizontally oriented electrode by a cell dielectric.

* * * * *